United States Patent [19]
Yamada et al.

[11] Patent Number: 5,324,929
[45] Date of Patent: Jun. 28, 1994

[54] DEVICE FOR DETECTING POSITION AND INTENSITY OF LIGHT AND POSITION DETECTING ELEMENT TO BE EMPLOYED THEREIN

[75] Inventors: Manabu Yamada, Anjo; Shoichi Onda, Toyokawa; Kenichi Hanaki, Kariya; Masashi Harada, Hekinan, all of Japan

[73] Assignee: Nippondenso Co., Ltd., Kariya, Japan

[21] Appl. No.: 840,916

[22] Filed: Feb. 25, 1992

[30] Foreign Application Priority Data

Feb. 26, 1991 [JP] Japan .................................. 3-55910
Dec. 17, 1991 [JP] Japan ................................. 3-353794

[51] Int. Cl.⁵ ...................................... H01J 40/14
[52] U.S. Cl. .................... 250/214.1; 257/458
[58] Field of Search .............. 250/214.1, 214 PR, 561; 257/431, 458, 461, 465

[56] References Cited

U.S. PATENT DOCUMENTS

| | | | |
|---|---|---|---|
| 3,875,402 | 4/1975 | Parkin | 250/214.1 |
| 4,874,939 | 10/1989 | Nishimoto et al. | 250/214 PR |
| 4,887,140 | 12/1989 | Wang | 257/458 |
| 4,961,096 | 10/1990 | Idesawa . | |
| 5,126,815 | 6/1992 | Murakami et al. | 257/458 |

FOREIGN PATENT DOCUMENTS

| | | |
|---|---|---|
| 1083395 | 9/1967 | United Kingdom . |
| 2220794 | 1/1990 | United Kingdom . |
| 0206363 | 12/1986 | European Pat. Off. . |
| 62-42470 | 2/1987 | Japan . |
| 62-71713 | 4/1987 | Japan . |
| 63-164281 | 7/1988 | Japan . |
| 63-278284 | 11/1988 | Japan . |

Primary Examiner—David C. Nelms
Attorney, Agent, or Firm—Cushman, Darby & Cushman

[57] ABSTRACT

A device for detecting direction, height and intensity of a light which facilitates detection and provides high accuracy. The device includes a glass substrate, on which a resistant layer for detecting the X coordinate position, a photoconductive layer utilizing the photoconducting effect of a photoelectric converting layer, and a resistant layer of metallic electrode resistor body for detecting the Y coordinate position, laminated in order. The resistant layers are provided respective two lead electrodes X, X' and Y, Y'. By applying 5V and 0V, for example, to X and X', a voltage Vx corresponding to the position where the light is irradiated can be directly obtained through Y or Y'. Namely, the X coordinate position of the point where the light passes can be easily and accurately detected. By applying +5V and 0V for Y and Y', Y coordinate of the light irradiated point can be obtained, and by applying the same potential to X and X', light intensity can be obtained.

21 Claims, 28 Drawing Sheets

DIRECTION OF INCIDENT LIGHT BEAM

Fig. 6

| SYMBOL IN FIG. | | 41 | 42 | 43 | 44 | 45 |
|---|---|---|---|---|---|---|
| | | n | i | p | i | n |
| AMOUNT OF GAS FLOW (SCCM) | SiH4 | 8 | 50 | 6.6 | 35 | 8 |
| | CH4 | — | — | 15.4 | 15 | — |
| | B2H/H2 | — | — | 68 | — | — |
| | 1%PH3/H2 | 8 | — | — | — | 8 |
| | H2 | 384 | 200 | 130 | 200 | 384 |
| INTERNAL PRESSURE (Torr) | | 1.0 | 1.1 | 1.0 | 1.1 | 1.0 |
| RF POWER (W) | | 100 | 40 | 40 | 40 | 100 |
| TEMPERATURE OF THE SUBSTRATE (°C) | | 180 | 180 | 180 | 180 | 180 |
| FILM THICKNESS (nm) | | 25 | 450 | 10 | 200 | 60 |

NOTE  (SCCM) SHOWS A GAS FLOW (cc/min) AT A STANDARD PRESSURE TEMPERATURE
(Torr) SHOWS AN UNIT OF PRESSURE
RF POWER SHOWS A POWER OF HIGH FREQUENCY ELECTRIC FIELD IN PLASMA CVD METHOD

-⊙⊙-: SHOWS A BATTERY COMPONENT HAVING AN ELECTROMOTIVE FORCE

DIRECTION OF AN INCIDENT LIGHT

○ : CONVENTIONAL ONE
● : PRESENT INVENTION

EFFECTIVE AREA OF POSITION
DETECTING MEANS IN Fig. 16

SQUARE SHAPE

±10% F.S.

DOT SHAPE

±12% F.S.

CONCAVE SHAPE

±6% F.S.

CONVEX SHAPE

±14% F.S.

EFFECTIVE AREA OF POSITION
DETECTION MEAN

Fig. 30

|  | MATERIAL | FILM THICKNESS (nm) | LIGHT CURRENT (μA) |
|---|---|---|---|
| i1 FILM | a-SiC | 170 | 120 |
| i2 FILM | a-Si | 450 | 120 |

DEVICE FOR DETECTING POSITION AND INTENSITY OF LIGHT AND POSITION DETECTING ELEMENT TO BE EMPLOYED THEREIN

BACKGROUND OF THE INVENTION

1. Field of the Invention

The present invention relates to a device for detecting a position and an intensity of light. The invention can detect irradiating direction, height, intensity, insolation of sun beam, for example, utilizing the photoconducting effect of amorphous silicon type semiconductor and so forth. The present invention is particularly, but not limitatively, applicable for an air conditioner system for an automotive vehicle to detect intensity of insolation with high precision for providing data for the calculation of insolation dependent thermal load.

2. Description of the Related Art

Such technology has been proposed in Japanese Unexamined Patent Publication (Kokai) No. 59-328116 for "Photo Potentiometer" and Japanese Unexamined Patent Publication No. 63-164281 for "Position Detecting Device". The former publication proposes a position detecting device (photo potentiometer) employing a photoconductive film that lowers its resistance value when light is irradiated thereon. The later publication discloses a position detecting device that comprises a conductive layer including a amorphous semiconductor layer with a p-i-n junction, a transparent conductive layer and a metal.

In the former position detecting device employing the photoconductive film, a leak current is caused at a portion not irradiated by a light beam due to thermal excitation of electrons at elevated temperatures, as shown in FIG. 35. The leak current can offset an output voltage from a component potential value corresponding to a light irradiating position (position of a light spot H) to make an accurate measurement of the position difficult.

On the other hand, in the case of the later position detecting device employing the amorphous semiconductor layer, the following problems can be encountered. A light current detected by irradiation of the light beam normally has a small magnitude, e.g. 100 nA. This requires a high sensitivity amplifier for subsequent arithmetic processes. As a result, the device becomes large and expensive.

The present invention solves the problems set forth above. Therefore, it is an object of the present invention to provide a device for detecting a position and an intensity of a light which has a large magnitude of output voltage corresponding to irradiation of a light beam (high sensitivity), can provide stable detecting accuracy for a minimized leak current even at an elevated temperature, and can provide a signal indicative of an irradiating direction, the height of a light as well as intensity of the light.

SUMMARY OF THE INVENTION

According to one aspect of the invention, a device for detecting position and intensity of light comprises:

at least one resistantive layer;

a photoelectric converting layer laminated on the resistantive layer in overlapping manner and forming diode components having opposite polarity to each other and arranged in series, the diode components being adapted to become conductive at a portion where a light passes and cause photoelectromotive force therein;

input electrodes for establishing predetermined potential distribution on the resistant layer in a plane direction on the resistant layer;

an output electrode for extracting the predetermined potential on the resistant layer through the portion where the light passes;

means for irradiating a light in a spot form onto the photoelectric converting layer through the resistant layer for obtaining a signal representative of the position and intensity of light irradiated in a spot form.

According to the second aspect, the device according to the first aspect is provided on an automotive vehicle, and the means for irradiating spot form light comprises a means for irradiating a spot form sun beam irradiating on the automotive vehicle so that the signal representative of the direction, height and intensity of said sun beam can be obtained through the output electrode.

According to the third aspect of the invention, if the device according to the first aspect, four input electrodes are provided on four corners of the resistant layer, signals indicative of the position of the light and the intensity of the light are extracted through the output electrode at different times in a time division manner.

According to the fourth aspect of the invention, in the device according to the third aspect of the invention, the diode components of the photoelectric converting layer comprise mutually opposite polarities of diode components that have different magnitude of photoelectromotive forces in the irradiation of light to cause an imbalance so that the difference component of the photoelectromotive forces is added to the signal obtained through the output electrode.

According to the fifth aspect of the invention, in the device according to the first aspect of the invention, the resistant layer comprises a first resistant layer positioned close to the light and a second resistant layer positioned away from the light with respect to the traveling direction of the light beam, the first and second resistant layers respectively having input electrodes to alternately establish potential distributions in mutually intersecting directions on a time division basis, and the output electrode comprises a first output electrode provided on the second resistant layer and serving in common to the input electrode for extracting the predetermined potential on the first resistant layer through the photoelectric converting layer, and a second output electrode provided on the first resistant layer and serving in common as the input electrode for extracting the predetermined potential on the second resistant layer through the photoelectric converting layer.

According to the sixth aspect of the invention, in the device according to the fifth aspect of the invention, the diode components in the photoelectric converting layer comprise mutually opposite polarities of diode components that generate electromotive forces having substantially balancing magnitudes.

According to the seventh aspect of the invention, the device according to the fifth aspect of the invention is provided on an automotive vehicle, and the means for irradiating a spot form light comprises a means for irradiating a spot form sun beam irradiating on the automotive vehicle so that the signal representative of the direction, height and intensity of said sun beam can be obtained through the output electrode.

According to a further aspect of the invention, a position detecting element comprises:

a substrate;

a resistant layer formed on the substrate;

two pairs of input electrodes on the resistant layer along the peripheral edge thereof and arranged to apply voltages in mutually perpendicular directions to each other;

a photoelectric converting layer formed on the resistant layer and having photo-diodes having mutually opposite polarities and arranged in series; and an output electrode layer formed on the photoelectric converting layer.

According to a still further aspect of the invention, a position detecting element comprises:

a substrate;

a second resistant layer formed on the substrate;

a photoelectric converting layer formed on the resistant layer and having photo-diodes having mutually opposite polarities and arranged in series; and a first resistant layer formed on the photoelectric converting layer;

a pair of electrodes provided along the opposing two edges of the second resistant layer; and a pair of electrodes provided along the opposing two edges of the first resistant layer; the pair of electrodes on the first resistant layer oppose each other in a direction perpendicular to the opposing direction of the pair of electrodes on the second resistantive layer.

In the construction set forth above, each electrode may serve as an input electrode and an output electrode in common.

In addition, the resistant layer may be provided sheet resistance value within a range greater than or equal to 10 $\Omega/cm^2$ and less than or equal to 1 M$\Omega/cm^2$. Also, the photoelectric converting layer may be formed of a material selected among amorphous alloy hydride, such as a-Si:H, a-SiC:H, a-SiGe:H, a-SiN:H, $\mu$c-Si:H or fluoride thereof or a composite semiconductor material including CdS, CdTe, CdSe, CuInSe$_2$ and so forth, and formed into n-i-p-i-n layer structure, p-i-n-i-p layer structure, n-p-n layer structure and p-n-p layer structure.

The photoelectric converting layer may employ a first i layer and a second i layer having mutually different material having different peak sensitivity wavelength, and the second i layer is formed to be thicker than the first i layer.

In the foregoing construction, the position detecting device may further have a light insulation member having a pin hole at the center thereof. The position detecting device may further comprise an optical member having a greater refraction index than the air and arranged on the position detecting element. In the alternative, the position detecting device may comprise a transparent resin disposed within the pin hole.

The devices set forth above may further comprise a means for alternatively applying voltages having a predetermined voltage difference through two pairs of input electrodes and a means for detecting voltage output through the output electrode layer of the position detecting element based on the voltage applied by the voltage applying means.

In this case, the device may further comprise a means for simultaneously applying equal voltages for two pairs of input electrodes of the position detecting element; and a means for detecting current output from the photoelectric converting layer of the position detecting element in response to an application of voltage by the means for simultaneously applying an equal voltage through the output electrode layer of the position detecting element.

BRIEF DESCRIPTION OF THE DRAWINGS

FIG. 6 is an explanatory illustration showing the condition to form a photoconductive film with a n-i-p-i-n layer structure;

FIG. 30 is an explanatory illustration showing the principle in the detection of a X coordinate, Y coordinate and current in the position detecting device of the invention;

DESCRIPTION OF THE PREFERRED EMBODIMENTS

The practical embodiments of a position detecting device according to the present invention will be discussed in detail herebelow.

Figure 1:
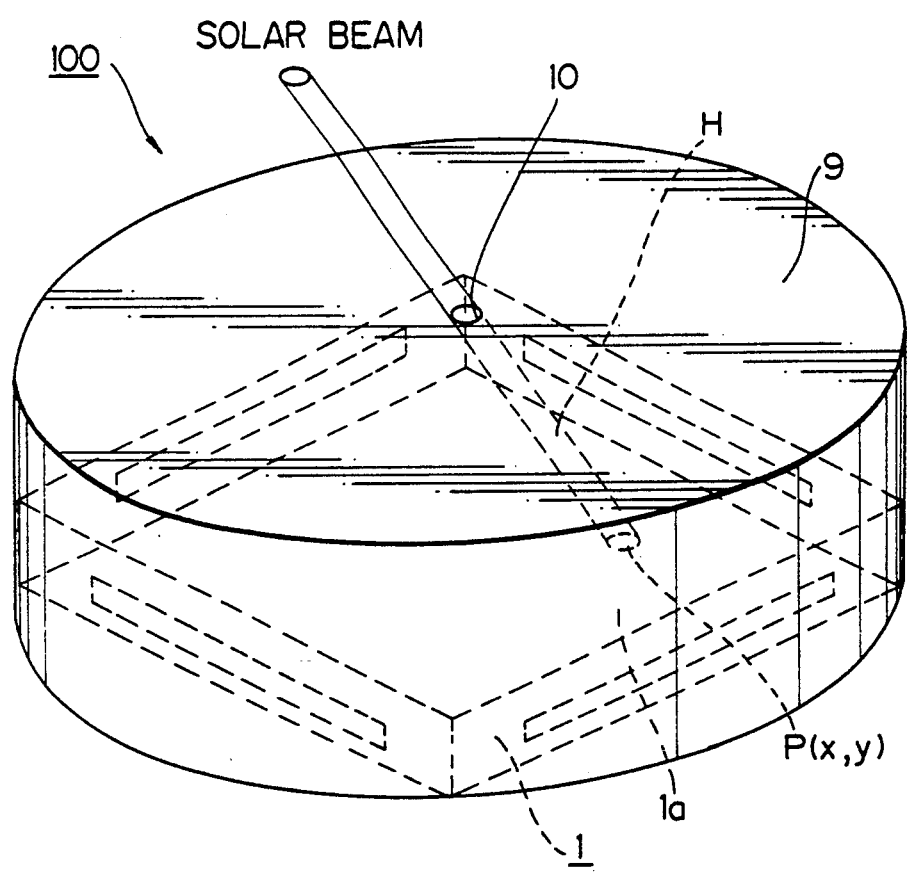
FIG. 1 is a schematic perspective view of an omnidirectional insolation sensor employing one embodiment of a position detecting device according to the present invention.

FIG. 1 schematically shows an omnidirectional insolation sensor 100 that is constructed employing a position detecting device according to the present invention.

The omnidirectional insolation sensor 100 generally comprises a position detecting element 1 and a light insulation member 9. For providing light insulation for the upper and side surfaces of the position detecting element 1, an essentially cylindrical light insulation member 9 surrounds the position detecting element 1. The light insulation member 9 is formed with a pin hole 10 at the center of the upper surface thereof. The light insulation member 9 and the pin hole 10, in combination, form a means for irradiating a light beam on the position detecting element 1 in the form of a spot. Sun beam enters within the interior space of the light insulation member 9 through the pin hole 10 to form a light spot H. An irradiating point P(x, y) on a detecting surface 1a of the position detecting element 1 reflects the direction and the height of the sun beam. Therefore, the omnidirectional insolation sensor 100 detects the direction and height of the sun beam by detecting the light spot irradiated on the detecting surface 1a of the position detecting device at the irradiating point.

Figure 2:
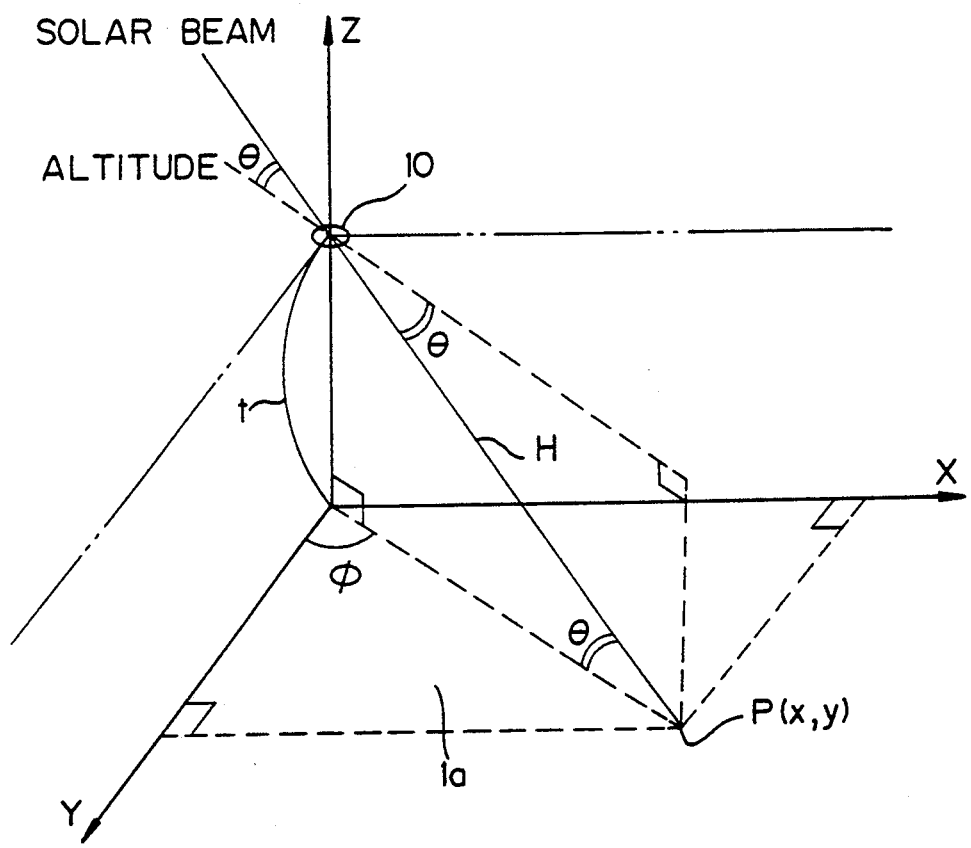
FIG. 2 is an explanatory illustration showing the manner of calculation of a direction and a height of a sun beam in an omnidirectional insolation sensor.

FIG. 2 shows a three dimensional coordinate system established with respect to the center of the detecting surface 1a of the detecting element 1. When the incident angle at the pin hole 10 of the upper surface of the light insulation member 9, corresponding to the height of the sun beam is $\theta$, and a distance between the pin hole 10 and the detecting surface 1a of the position detecting element 1 is t, the light spot H reaches the irradiating point P(x, y) on the detecting surface 1a of the position detecting device 1 with the incident angle $\theta$.

Here, an angle formed between the Y axis and a projected line of the light spot irradiating at the point P(x, y) on the detecting surface 1a of the position detecting element 1, the angle of which corresponds to the direction of the sub beam, can be expressed by $\phi$. Assuming that outputs (Vx, Vy), which will be discussed later, are proportional to the position P(x, y) relative to the origin of the coordinate system, the angles $\theta$ and $\phi$ can be expressed by:

$$\phi = \tan^{-1}(Vx/Vy)$$

$$\theta = \tan^{-1}\{t/Vx^2 + Vy^2)^{\frac{1}{2}}\}$$

Figure 3:
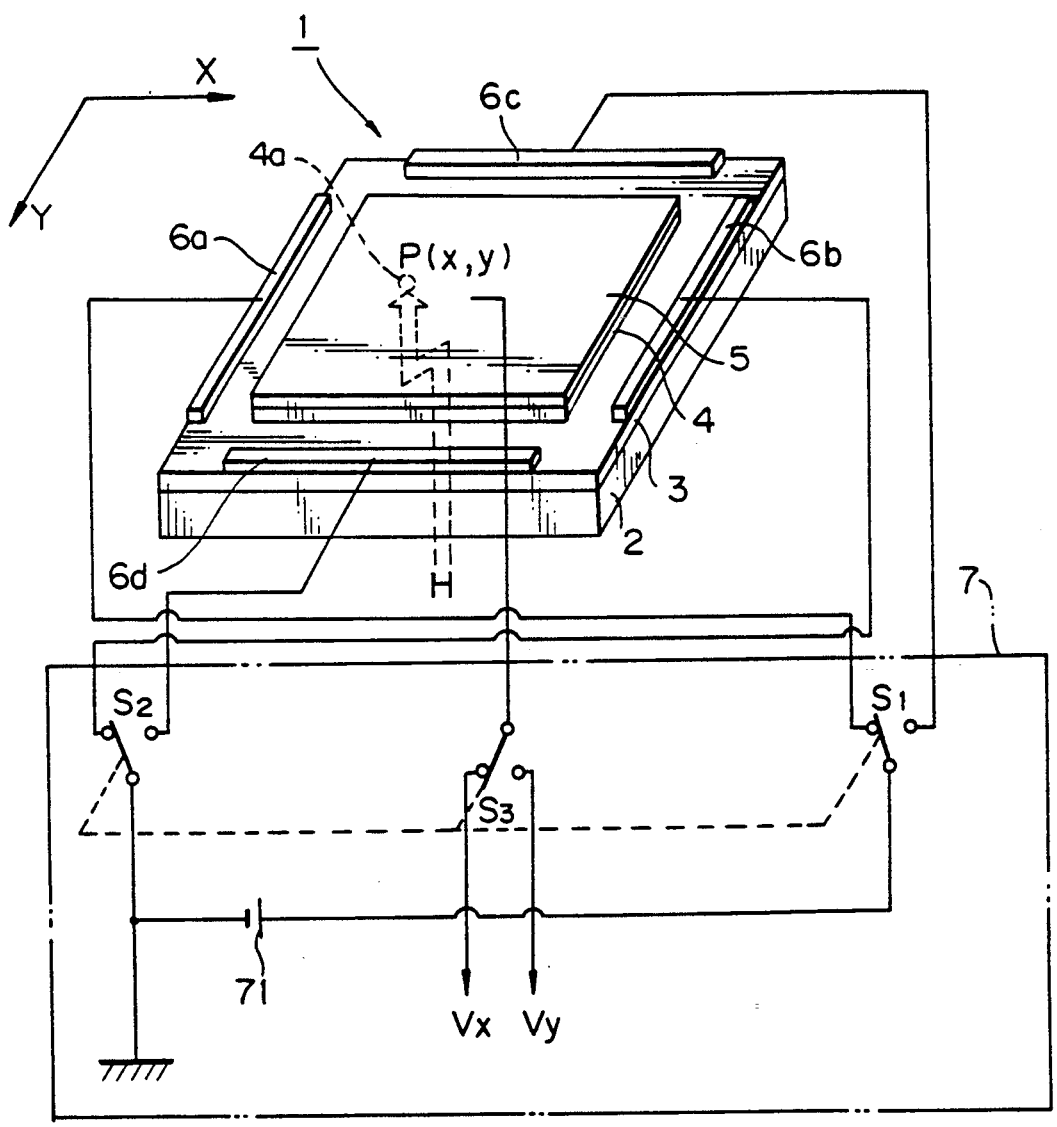
FIG. 3 is a diagrammatic illustration of the position detecting element in the omnidirectional insolation sensor of FIG. 1.
Figure 4:
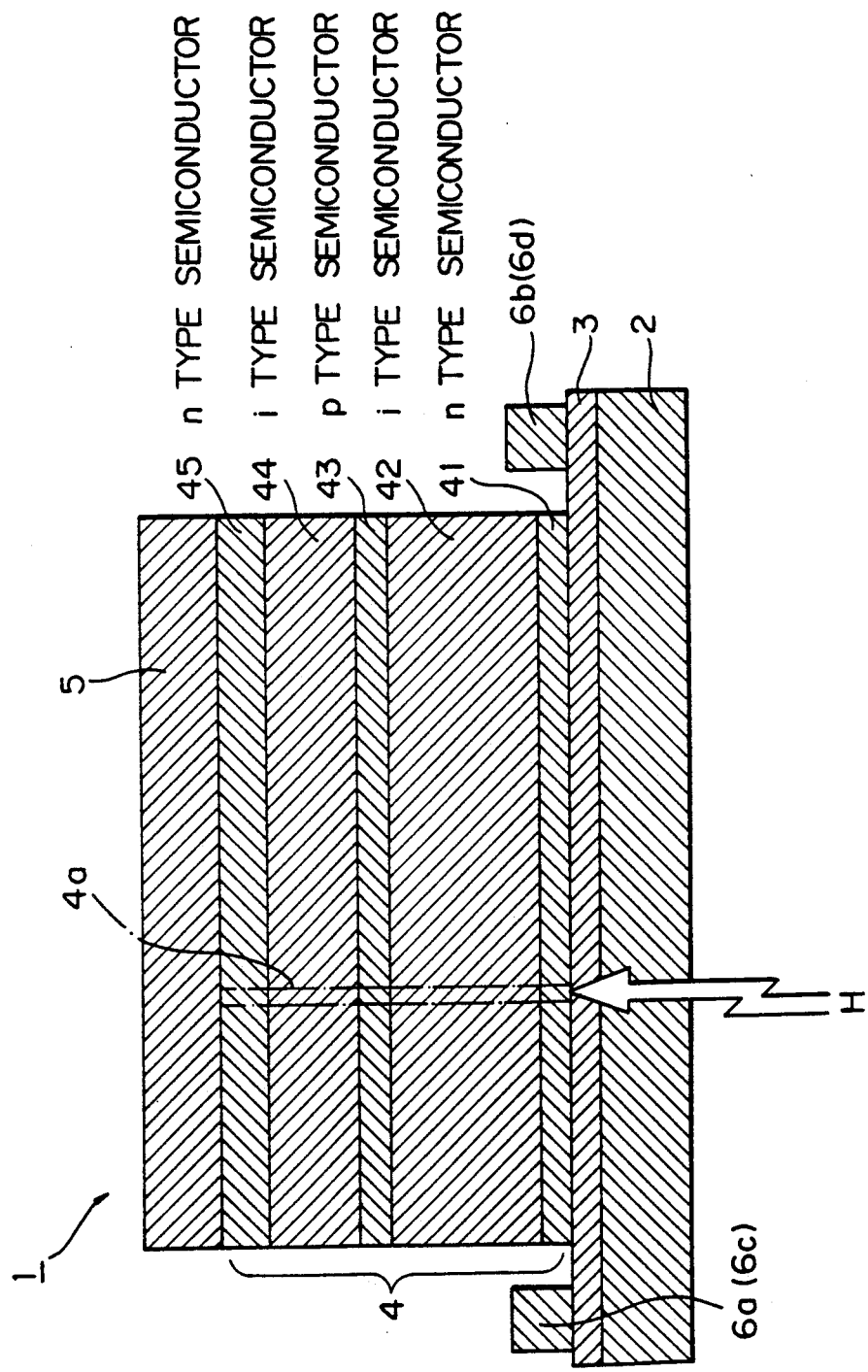
FIG. 4 is a section showing the layer construction of the position detecting element of FIG. 3.

FIG. 3 shows overall construction of the position detecting element 1 in the omnidirectional insolation sensor 100 set forth above. FIG. 4 is a longitudinal section showing layer structure of the position detecting element 1. It should be noted that, conversely to FIG. 1, FIGS. 3 and 4 are illustrated in a fashion, in which the light spot H enters from the lower side of the position detecting element 1.

In the fabrication of the position detecting element 1, a layer of metal oxide, such as $SnO_2$, ITO, ZnO or so forth, is formed on a glass substrate 2 as a resistant film layer 3. The resistant film layer 3 is preferably transparent. On the resistant film layer 3, amorphous silicon (hereafter referred to as a-Si) alloy layers are deposited as a n-i-p-i-n layer structure or p-i-n-i-p layer structure. By this, a photoelectric converting film layer 4 with a structure in which two diode components having mutually opposite polarities are arranged in series is formed. As a result, when either polarity of voltage is applied to the series diode components, no current is permitted to flow. On the photoelectric converting film layer 4, a common output electrode 5 is formed. The photoelectric converting layer 4 is formed of Al, Cr, Ni, Ag or so forth. The plane defined on this common output electrode 5 forms a position detecting region for detecting the light spot H. Adjacent peripheral edges of the resistantive film layer 3, two pairs of input electrodes 6a. 6b and 6c, 6d are arranged therealong so that the directions to apply the voltages are perpendicular to each other. The input electrodes 6a, 6b and 6c, 6d are formed of Al, Cr, Ni, Ag or so forth into a conductive thin film layer by patterning. These input electrodes 6a, 6b and 6c, 6d are pairs of electrodes respectively for X coordinate position detection and Y coordinate position detection.

It should be noted that the resistance value of the resistant film layer 3 is greater than or equal to 10 $\Omega/cm^2$ and smaller than or equal to 1 $M\Omega/cm^2$, and preferably, greater than or equal to 100 $\Omega/cm^2$ and smaller than or equal to 1 $K\Omega/cm^2$. The reason is that if the resistance is too small, the difference of the resistance values between common output electrode 5 becomes too small to make the resistant film layer inoperative as a resistant layer. Conversely, when the resistance is excessively high, it may become higher than the resistance (in case of a-Si, approximately 1 $K\Omega$ to 500 $K\Omega$) of the photoelectric converting layer 4 so as to make it impossible to obtain the output.

Figure 5:
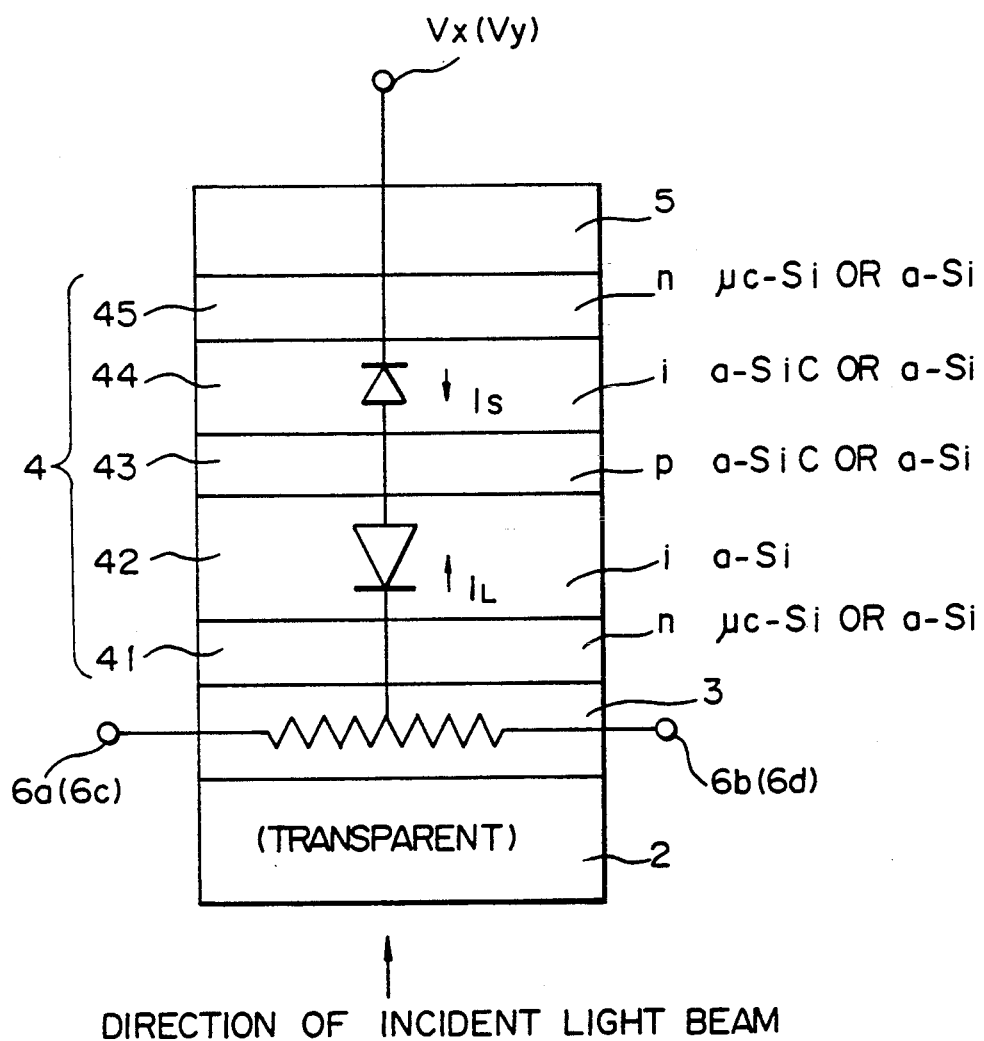
FIG. 5 is a diagrammatic illustration showing the laminated layer structure of FIG. 4.

FIG. 5 is a diagrammatical illustration showing the layer structure as shown in FIG. 4. In FIG. 5, the photoelectric converting layer 4 is formed into a n-i-p-n layer structure. In FIGS. 4 and 5, it is preferred to form the photoelectric converting layer 4 with a n-type semiconductor 41 of $\mu$c-Si:H (fine crystalline silicon), i-type semiconductor 42 of a-Si:H (non-crystalline silicon), p-type semiconductor 43 of a-SiC:H, i-type semiconductor 44 of a-SiC:H, and p-type semiconductor 45 of $\mu$c-Si:H in order from the side of the resistant film layer 3, such as a transparent resistant film layer. FIG. 6 shows the condition to form the laminated layers of the photoelectric converting layer 4 having the above-mentioned n-i-p-i-n layer construction.

The reason to employ the fine crystalline silicon for forming the first n-type semiconductor 41 is to receive an incident light beam to the second i-type semiconductor 42 as much as possible so that the larger light current IL can be generated in the photodiode (switching diode) formed by the n-type semiconductor 41, the i-type semiconductor 42 and the p-type semiconductor 43 at the side of the resistant film layer 3. On the other hand, the reason the fourth i-type semiconductor 44 is formed thinner than the second i-type semiconductor 42 is to make a smaller light current Is to be generated in the photo-diode formed by the p-type semiconductor 43, the i-type semiconductor 44 and the n-type semiconductor 45. The reason to use the fine crystalline silicon in the fifth n-type semiconductor 45 is to obtain good contact with the common output electrode 5.

Figure 8:
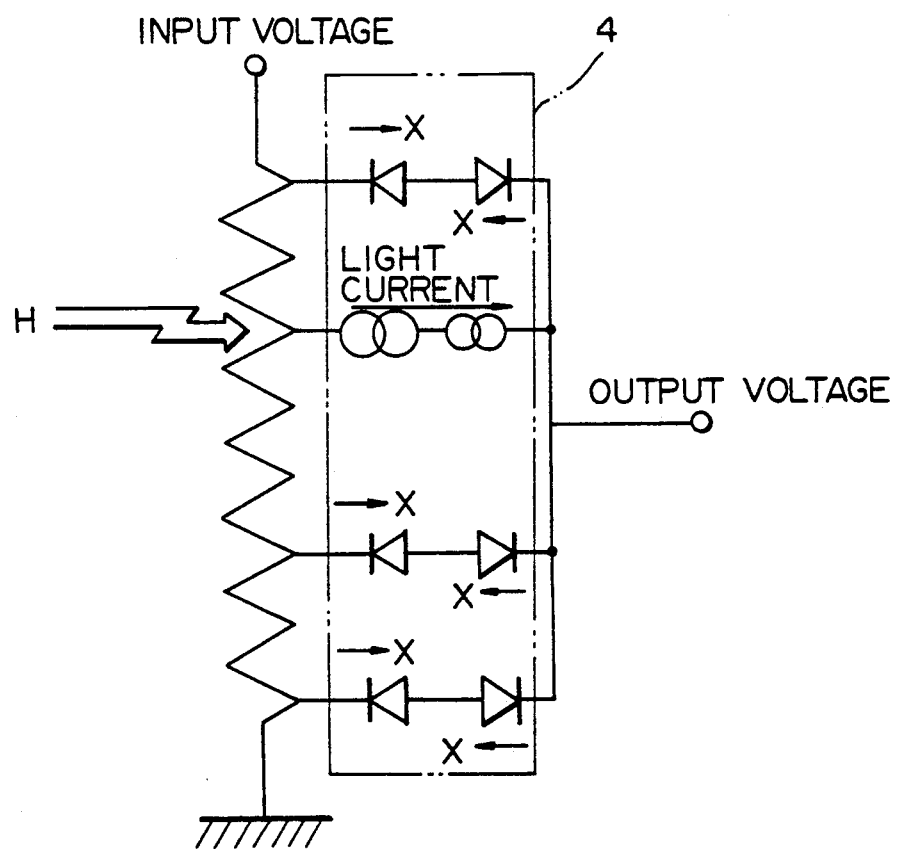
FIG. 8 is a schematic diagram showing circuit construction in the position detecting element according to the present invention.
Figure 10:
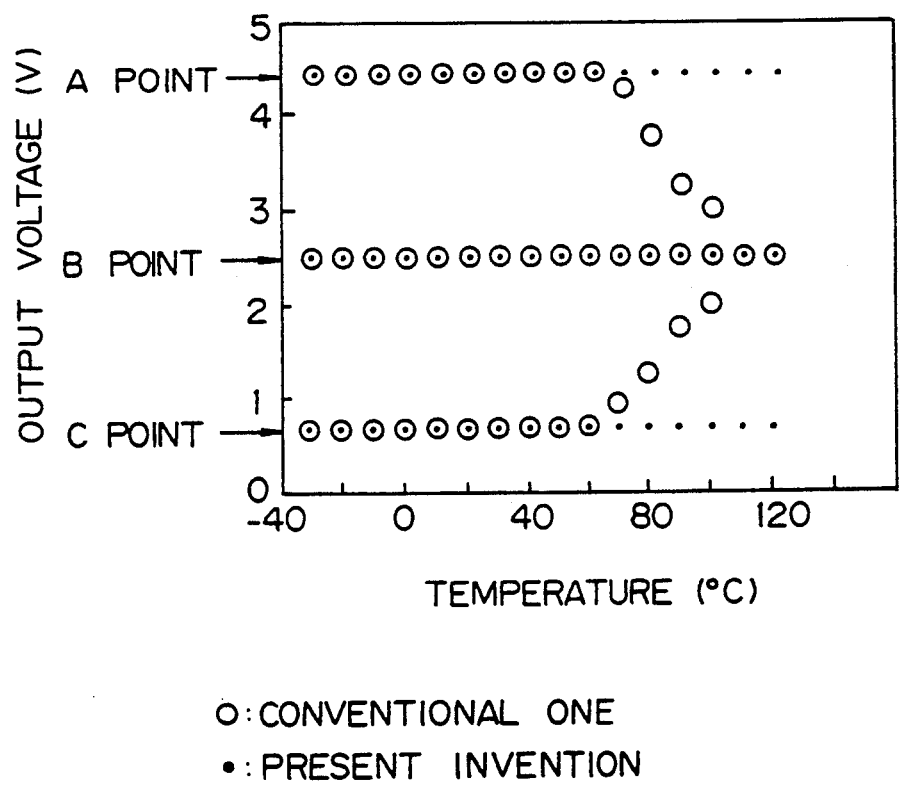
FIG. 10 is a characteristic chart showing the relationship between the output voltage and the temperature in the conventional position detecting element and in the position detecting element of the present invention.

FIG. 8 is a diagrammatic illustration of a circuit of the position detecting element 1 of the present invention. FIG. 10 is a characteristic chart showing the relationship between the output voltage and the temperature in the position detecting element in the prior art and in the present invention. As is clear from FIG. 10, in the position detecting element 1 according to the invention, the output voltages at irradiating points A, B and C are clearly differentiated from each other and remain unchanged even when the temperature is elevated.

As set forth above, the conventional position detecting element employs a photoconductive layer that lowers resistance according to the elevation of the temperature. Namely, at an elevated temperature, leak current occurs at the portion not irradiated by the light beam to offset the output voltage from the value divided corresponding to the irradiation point of the light spot.

In contrast to this, the position detecting element 1 according to the present invention, has diode components, in which a light current is generated by irradiation of the light beam in opposite relationship to each other to form the photoelectric converting layer 4. The position detecting element 1 employing thus constructed photoelectric converting layer 4 can prevent the leak current in an opposite direction to the output voltage from flowing by the rectification effect of the diode. Therefore, the output voltage will never fluctuate even at an elevated temperature thereby allowing an accurate measurement of the position.

Figure 7:
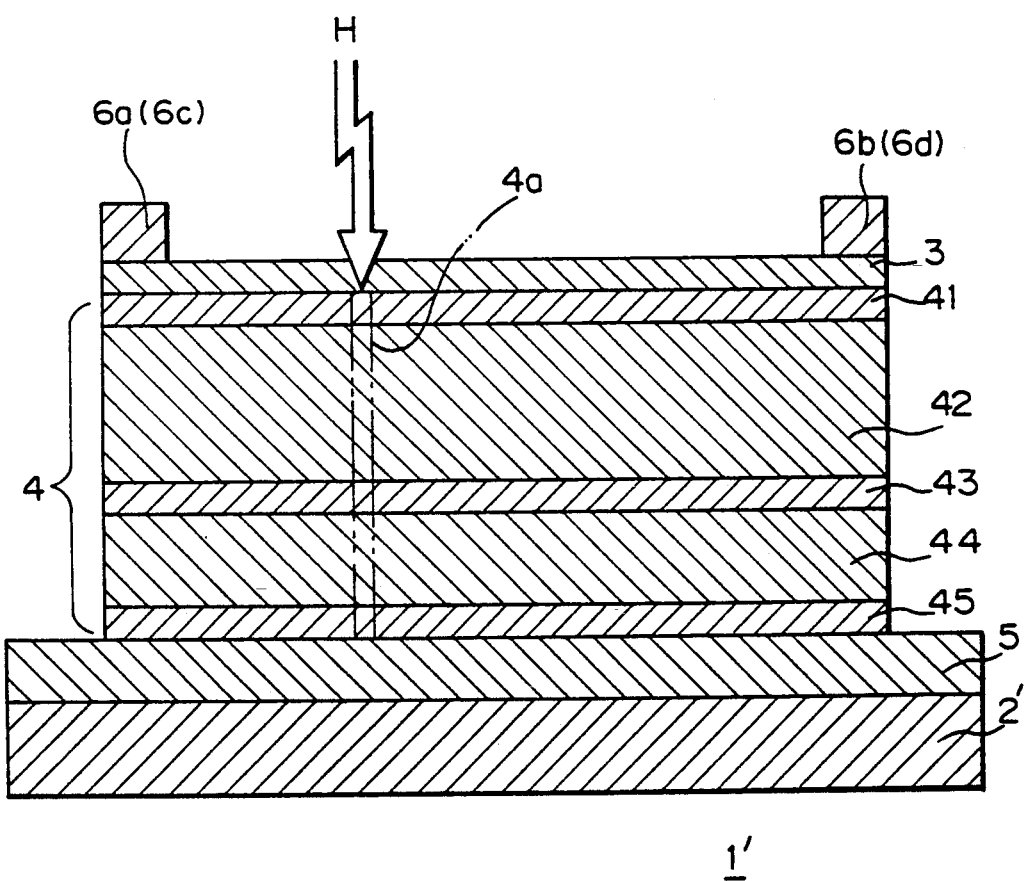
FIG. 7 is a longitudinal section showing another laminated layer structure of the position detecting element according to the invention.

It should be noted that the above-mentioned structure of the position detecting element 1 can be modified into the layer structure as illustrated in FIG. 7. In the layer structure of FIG. 7, the position detecting element 1' is fabricated by forming the resistant film layer 3, the photoelectric converting layer 4 and the common output electrode 5 in up-side-down fashion on a insulative substrate 2', which is fabricated employing SOS (silicon on sapphire) technology. In this case, the incident light is irradiated from the upper side. Consequently, the n-i-p-i-n layer structure of the photoelectric converting layer 4 of FIG. 4 is also fabricated in up-side down fashion. The input electrodes 6a, 6b and 6c, 6d are formed on the resistantive film layer 3 similarly to FIG. 4.

Figure 9:
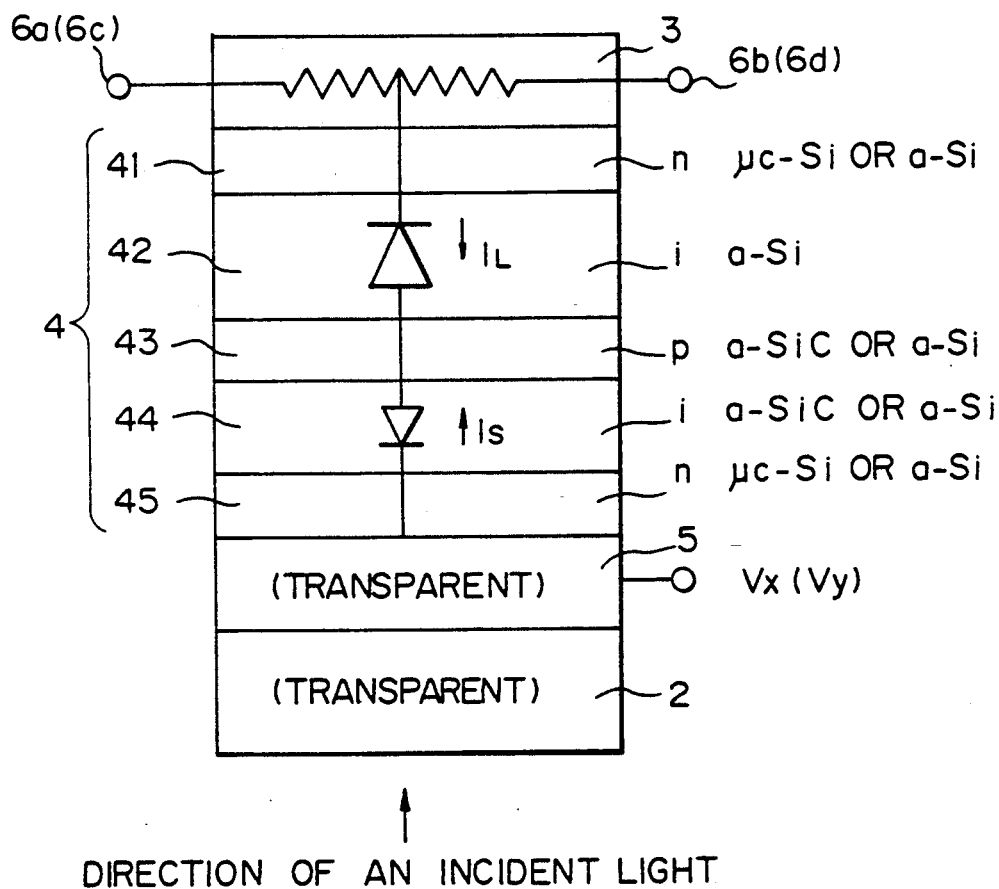
FIG. 9 is a diagrammatic illustration showing modification of the laminated layer structure of the position detecting element of FIG. 7.

FIG. 9 shows a modification of another structure of the position detecting element according to the invention illustrated in FIG. 7. In this modification, the positions of the resistant film layer 3 and the output electrode 5 are reversed relative to the incident light. Also, the positions of the layers in the photoelectric converting layer 4 are also reversed. In this case, transparency of the resistant film layer is unnecessary and the transparency of the output electrode is required. On the other hand, with respect to the incident light, the light current IL of the diode component at the side away from the output electrode 5 becomes smaller than the light current Is of the diode component close to the output electrode 5.

Operation of the position detecting element 1 is now discussed with reference to FIG. 1.

When voltages are applied to the input electrodes (for example, for input electrodes 6a and 6b) opposite the resistant film layer 3, such as a transparent resistant layer, each point of the resistant film layer 3 may have potential proportional to the distance from the input electrode. While the light spot H is absent, the photoelectric converting layer 4 blocks any flow of current by the rectification effect of the diodes. In response to irradiation of the light spot H, the light current is generated in the photoelectric converting layer 4. The photoelectric converting layer 4 permits this light current to flow. Namely, when the light spot H is irradiated at the point P(x, y) on the detecting surface at the side of the glass substrate 2, the light spot H passes the glass substrate 2 and the transparent resistantive film layer 3 to reach the photoelectric converting layer 4. Then, the portion of the photoelectric converting layer 4 corresponding to the irradiating point P(x,y) forms a conductive portion 4a. As a result, the potential corresponding to the irradiating point P(x, y), on which the light spot H is irradiated, is output to the common output electrode 5.

A detector circuit 7 is provided with switches S1 and S2. The detector circuit 7 is designed to simultaneously switch the switches S1 and S2 to alternatively apply the same voltage for the opposing pairs of input electrodes 6a, 6b, 6c, and 6d on the resistantive film layer 3 for detecting X and Y coordinate position detection. A switch S3 is also provided for switching outputs supplied to the common output electrode 5. The switch S3 is switched in synchronism with switching timing of the switches S1 and S2 for detecting and supplying the potential Vx representative of the X coordinate position of the irradiating point P(x, y) and the potential Vy representative of the Y coordinate position of the irradiating point P(x, y) to the common output electrode 5 on a time division basis, and independently of each other. Based on these outputs Vx and Vy, the direction $\phi$ and the height $\theta$ can be calculated.

Figure 11:
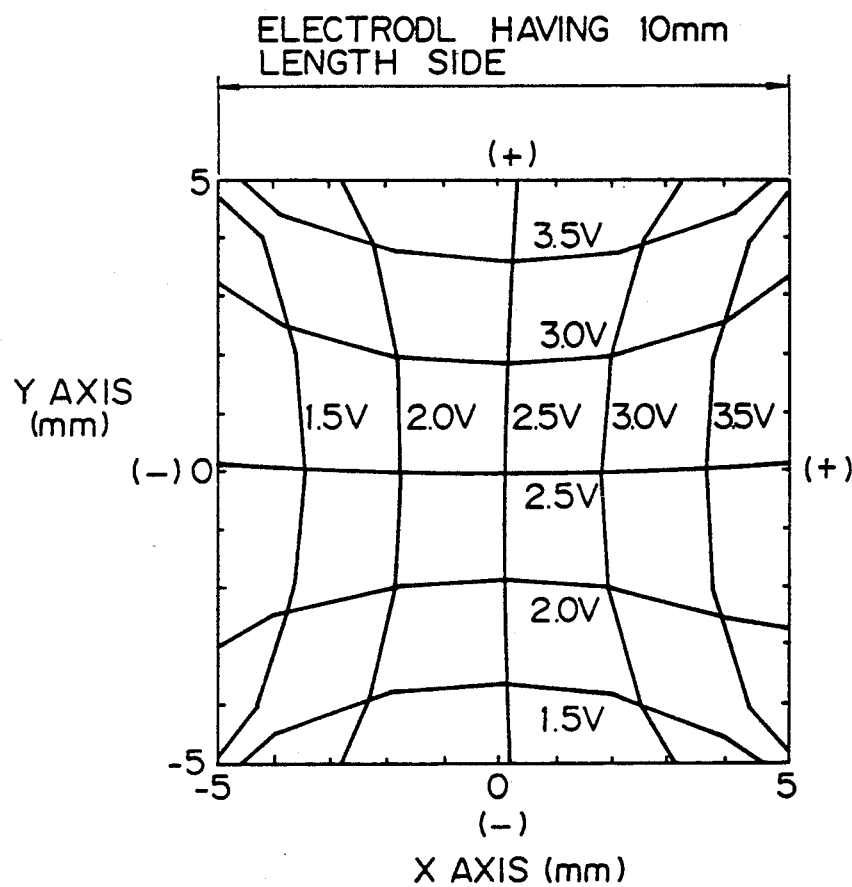
FIG. 11 is a characteristic chart showing equipotential lines of the potential Vx in a X coordinate and the potential Vy in a Y coordinate in the position detecting device of the present invention.

FIG. 11 is a characteristic chart showing equipotential lines of the potential Vx of the X coordinate position and the potential Vy of the Y coordinate position in the position detecting element 1. In the shown example, the position detecting element 1 has a square electrode 10 mm in edge length. The surface area of the electrode corresponds to the effective area of the position detecting portion in FIG. 17.

Figure 12:
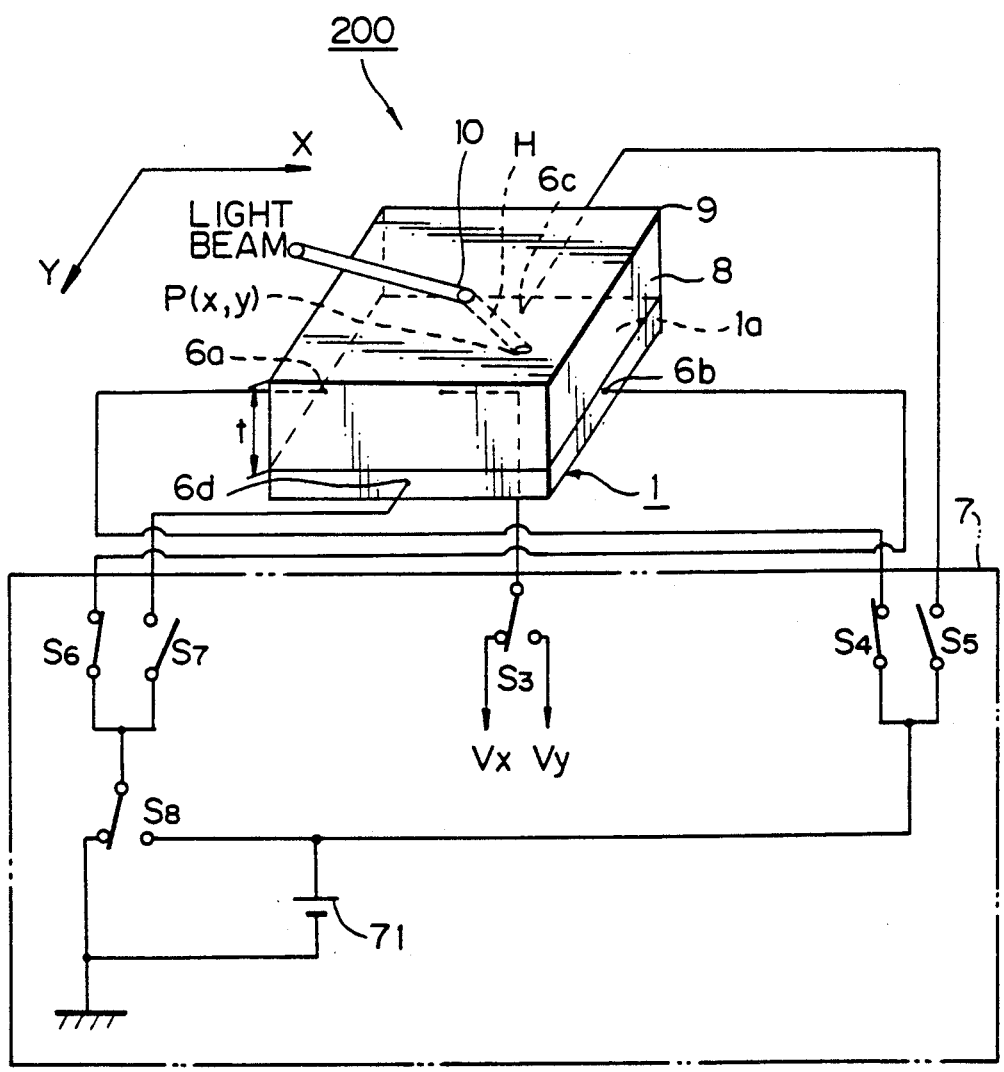
FIG. 12 is a diagrammatic illustration of another construction of omnidirectional insolation sensor employing the position detecting device according to the invention.

FIG. 12 shows the overall construction of another embodiment of the omnidirectional insolation sensor 200 employing the position detecting device according to the present invention.

The omnidirectional 200 includes a high refraction member 8 in addition to the construction of the omnidirectional insolation sensor 100 set forth above. The high refraction member 8 is disposed between the position detecting element 1 and the light insulation member 9. The high refraction member 8 comprises a parallel surface prism or so forth having a thickness t and a greater refraction index.

Similarly to the former embodiment, the sun beam enters the interior space of the light insulation member 9 through the pin hole 10 to form the light spot H. The light spot H is refracted by the high refraction member 8 and then irradiated on the detecting surface 1a of the position detecting element 1 at the irradiating point P(x, y). The direction and the height of the sun beam can thus be detected by the position detecting element 1. In addition, the shown embodiment of the omnidirectional insolation sensor 200 is adapted to further detect the magnitude of insolation.

To detect the X coordinate position, the switches S4 and S6 are turned ON, and the switch S8 is connected to the ground as shown. Then, the potential Vx representative of the X coordinate position of the irradiating point P(x, y) is output through the switch S3. Similarly, to detect the Y coordinate position, the switches S5 and S7 are turned ON, and the switch S8 is connected to the ground as shown. Then, the potential Vy representative of the Y coordinate position of the irradiating point P(x, y) is output through the switch S3.

Figure 13:
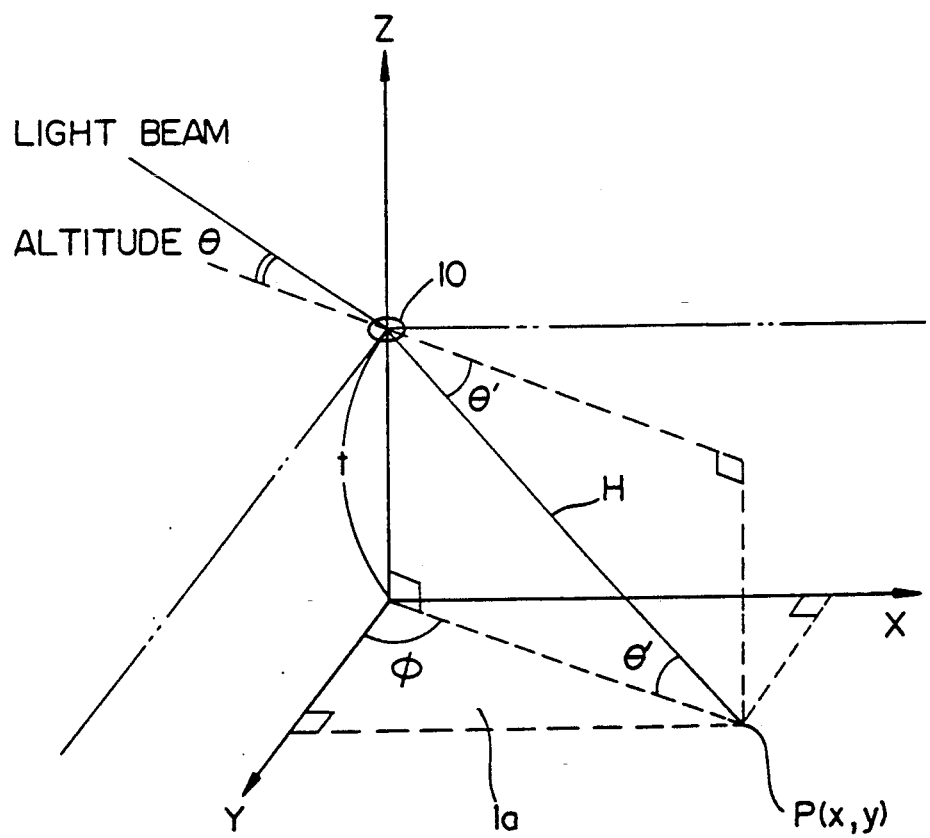
FIG. 13 is an explanatory illustration showing the manner of calculating direction and height of a sun beam in the omnidirectional insolation sensor of FIG. 11.

As shown in FIG. 13, the incident angle, at which the sun beam enters the interior space of the light insulation member 9 (FIG. 12) through the pin hole 10, is assumed as $\theta$. The incident angle $\theta$ corresponds to the height of the sun beam. Then, the angle of the light spot H passing through the high refraction member 8 becomes $\theta'$. Namely, the light spot H reaches the irradiating point P(x, y) with the incident angle $\theta'$.

Here, an angle formed between the Y coordinate axis and a projected line of the light spot H on the detecting surface 1a of the position detecting element 1 is $\phi$, the angle $\phi$ of which corresponds to the direction of the sun beam. Assuming that the outputs (Vx, Vy) are proportional to the position of P(x, y), the angle $\phi$ can be calculated based on the detected X, Y coordinate position of the irradiating point P(x, y) through the following equation:

$$\phi = \tan^{-1}(Vx/Vy)$$

Further assuming that the refraction index of the air is 1 and the refraction index of the high refraction member 8 is n1, the following relationship is established.

$$(\sin\theta/\sin\theta') = (1/n1)$$

Since the thickness of the high refraction member 8 is t, the height $\theta$ can be expressed by:

$$\theta = [t/\{n1^2(Vx^2 + Vy^2 + r^2) - r^2\}^{\frac{1}{2}}]$$

Figure 14:
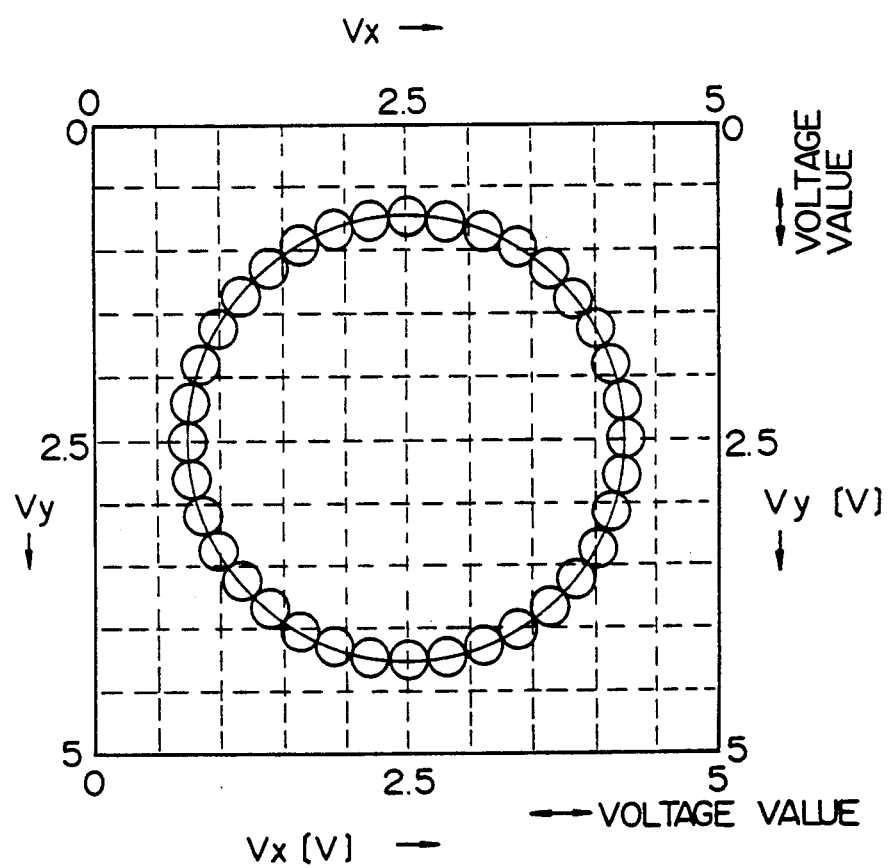
FIG. 14 is a characteristic chart showing output characteristics at height of 10° and every 10° of directions in the omnidirectional insolation sensor of FIG. 11.

Such high refraction member 8 is particularly effective at a relatively low incident angle, i.e. low height of the sun beam, such as $\theta = 10°$. Namely, the high refraction member 8 can avoid the possibility of reflection of the low incident angle of the sun beam. Therefore, the high refraction member 8 assures irradiation of the light spot H on the position detecting element 1 to enable detection of the position, i.e. height and direction and so forth, of the sun beam. FIG. 14 shows output characteristics at a fixed height of $\theta = 10°$ with stepwise variation of the direction per 10°.

Figure 15:
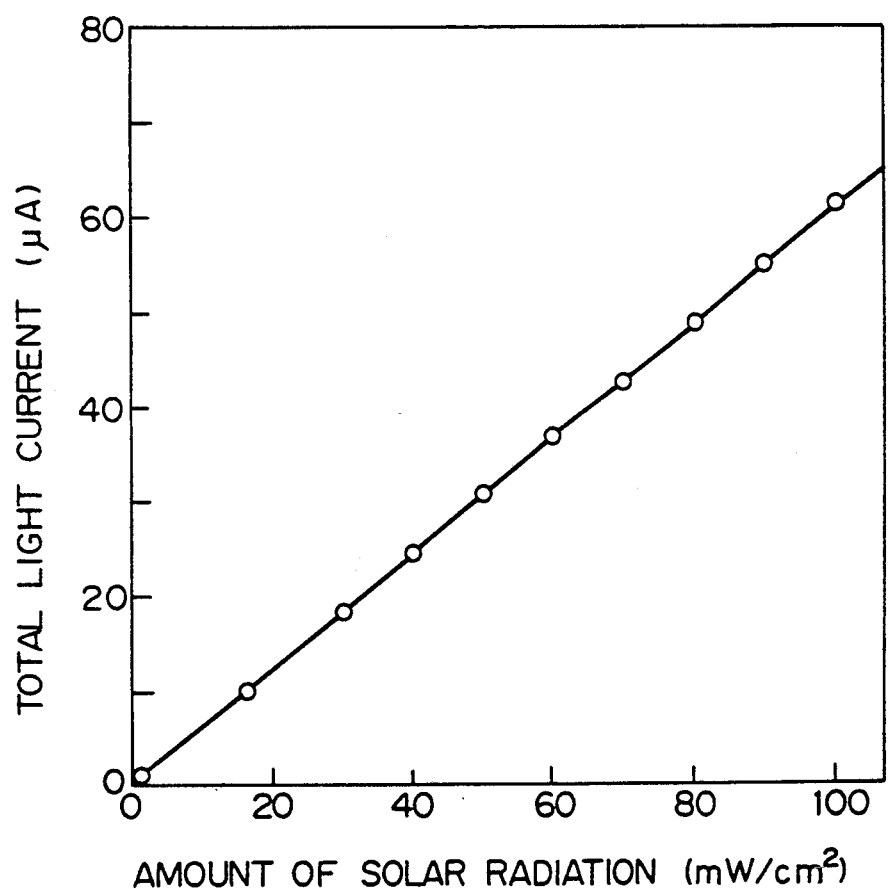
FIG. 15 is a chart showing output characteristics between insolation magnitude and an output current (light current) in the omnidirectional insolation sensor of FIG. 11.
Figure 16A:
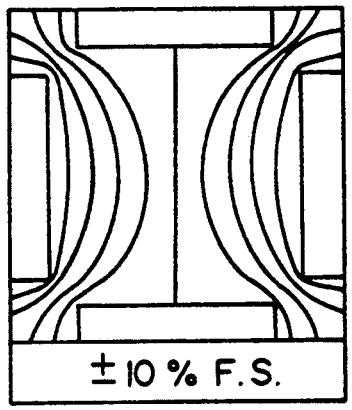
FIGS. 16(A) through 16(D) are characteristic charts showing experimentally obtained equipotential lines with varying configurations of input electrodes on a transparent resistant body film in the position detecting element of the invention.
Figure 16B:
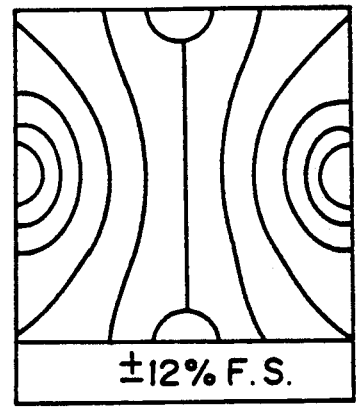
Figure 16C:
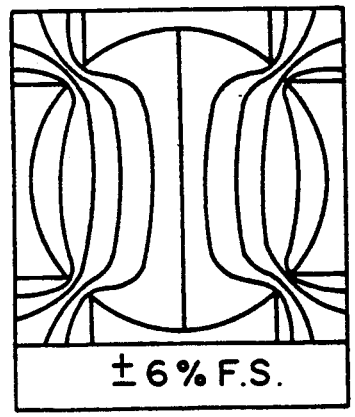
Figure 16D:
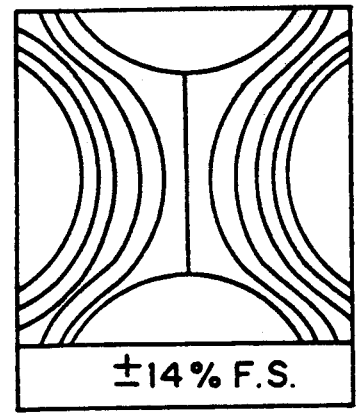

In the shown embodiment, light intensity, i.e. the magnitude of insolation, can be detected by turning all of the switches S4, S5, S6 and S7. In this case, the switch S8 is connected to the power source S8, and voltage is applied for all of the electrodes 6a, 6b, 6c, and 6d. In this condition, the current flowing through the common output electrode 5 is measured to derive the light intensity. The measured current contains an imbalance component of the light current caused in the photoelectric converting layer 4 and is proportional to the magnitude of insolation. FIG. 15 shows a relationship between the output current thus measured and the magnitude of insolation. As can be clear from FIG. 15, by measuring the output current, the magnitude of insolation can be derived.

FIG. 16 shows equipotential lines resulting from experiments performed with respect to variety of configurations of the input electrodes 6a, 6b, 6c and 6d. Experiments are performed with respect to square-shape, dot-shape, concave-shape and convex-shape of electrodes. Through analysis of the results of the said experiments, it has been found that when the input electrodes are in concave-shaped configuration, the accuracy of position detection within the effective area of the transparent resistantive film layer 3 is ±6% of full scala (F.S.) and thus better than those of other configurations.

Figure 17:
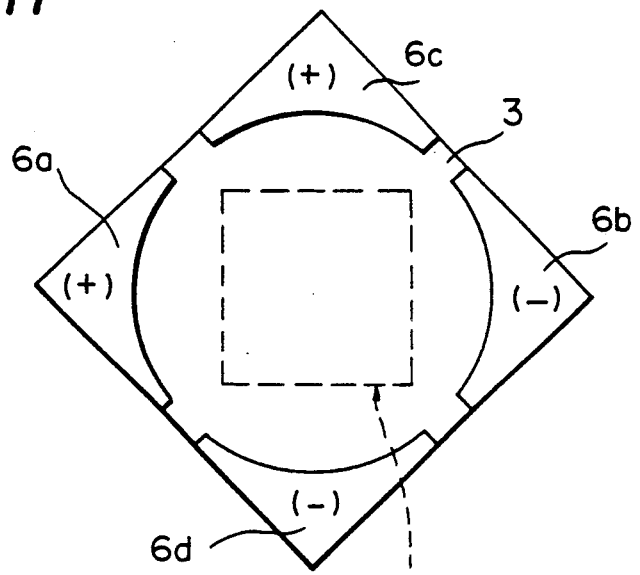
FIG. 17 is an explanatory illustration showing a recess type electrode configuration of the optimized input electrode.
Figure 18:
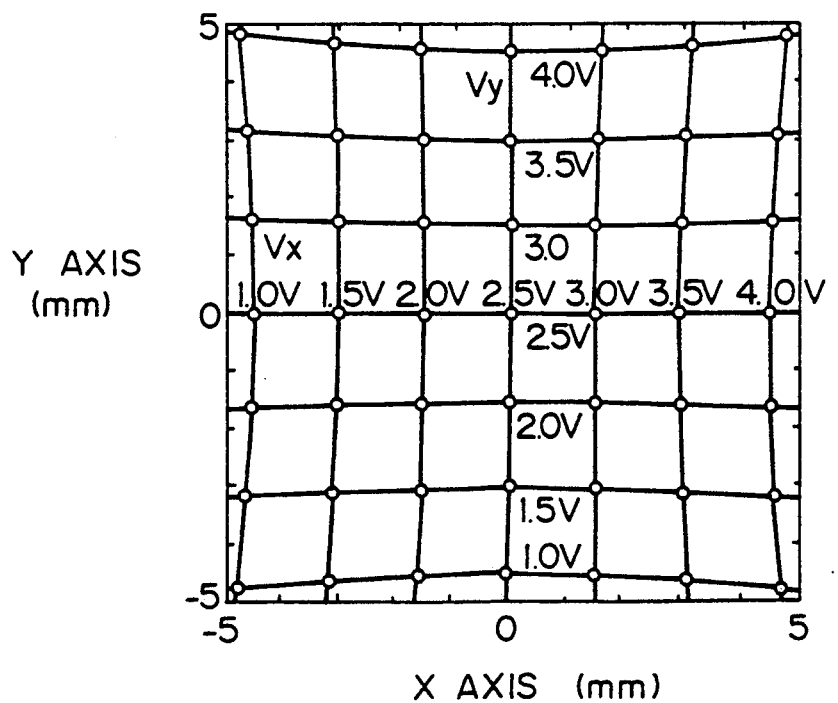
FIG. 18 is a characteristic chart showing equipotential lines of the potential Vx in a X coordinate and the potential Vy in a Y coordinate.

Further experiments are performed to find the optima concave construction. As a result of experiments, the concave configuration illustrated in FIG. 17 is found optimal. As can be seen from FIG. 17, the concave configurations of the input electrodes 6a, 6b, 6c and 6d are arranged at respective corners of the resistantive film layer so that each pair of the input electrodes 6a, 6b, and 6c, 6d are diagonally opposed to each other. With such configuration and arrangement of the input electrodes 6a, 6b, 6c and 6d, distortion of the equipotential lines becomes substantially small, as shown in FIG. 18. By the effect of the concaved input electrodes, the equipotential lines become substantially straight to further improve the accuracy of position detection to ±3% of the full scala within the effective area of the transparent resistant film layer 3.

Figure 19:
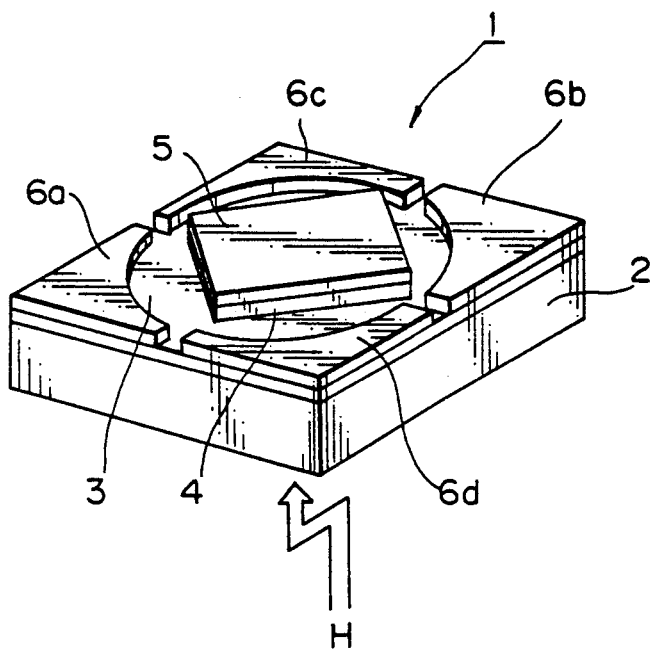
FIG. 19 is a perspective view of the position detecting element having the input electrode of the recessed electrode configuration of FIG. 16, on the transparent resistant film.
Figure 20:
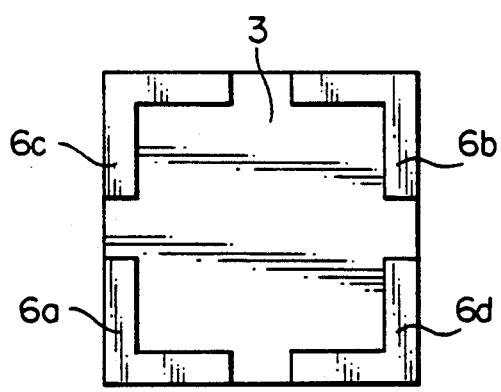
FIG. 20 is an explanatory illustration of the input electrode having an L-shaped electrode configuration.

FIG. 19 is a perspective view of the position detecting element 1 having concave-shaped input electrodes 6a, 6b, 6c and 6d arranged in the manner shown in FIG. 17. It is further found that L shaped input electrodes arranged in a manner as shown in FIG. 20, can exhibit similar measurement results. As can be appreciated herefrom, by improving configuration of the input electrodes, linearity of the coordinate values of the light spot and the output value can be improved. Such improvement of accuracy of detection of the X (Y) coordinate position can be obtained irrespective of irradiating position in the Y (X) axis direction.

Figure 21:
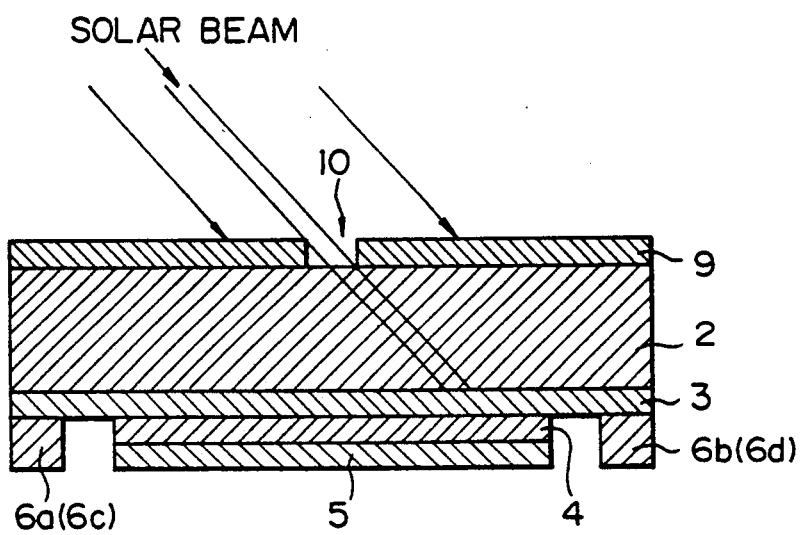
FIG. 21 is an longitudinal section showing the position detecting element, in which a light insulation member is formed by direct printing or disposition of a metal thin film on a glass substrate.

FIG. 21 shows modification of the manner of providing light insulation. In the embodiment of FIG. 21, the light insulation member 9 is formed by printing or depositing a thin metal film directly on the glass substrate 2 of the position detecting element. With said construction, the light insulation member 9 and the transparent resistantive film layer 3 are arranged in proximity to each other across the glass substrate 2. As a result, the detection range of the position detecting element 1 can be expanded. In addition, since the light insulation member 9 can be directly formed on the glass substrate 2 by printing or deposition as a substantially thin film, the sun beam at a substantially low incident angle will never be affected by the edge of the pin hole. This additionally contributes to the expansion of the angular range of detection of the position detecting element 1.

Figure 22:
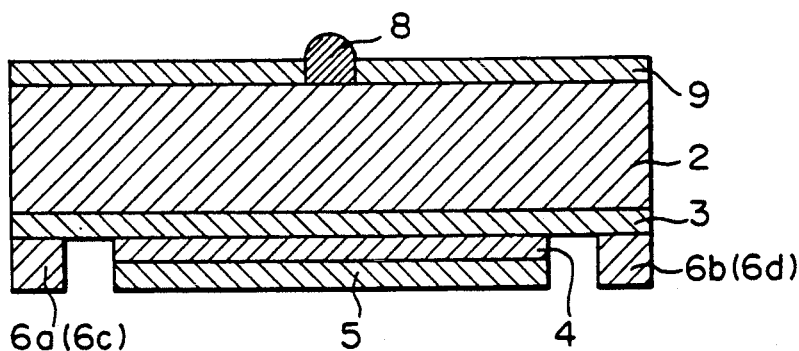
FIG. 22 is a longitudinal section of the position detecting element, in which a droplet of a fluidized transparent resin, such as silicon on a pin-hole section of the light insulation member is deposited and solidified to form a high refraction member as a replacement for a prism.
Figure 23:
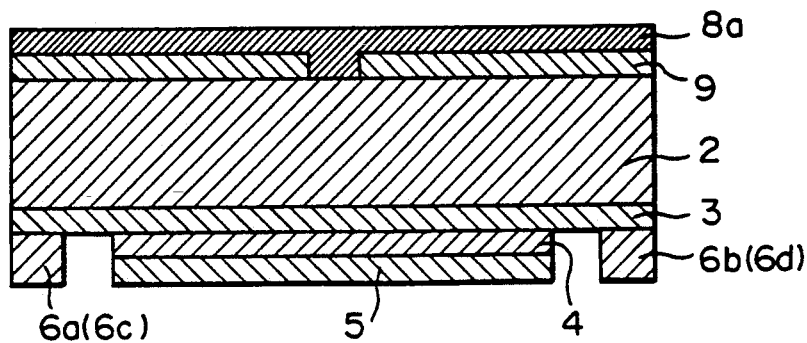
FIG. 23 is a longitudinal section of the position detecting element, in which a metal thin film is deposited on the light insulation member as a high refraction member and a transparent resin coat is provided over the overall surface of the light insulation member including the pin-hole.

FIG. 22 shows a further modification of the embodiment of FIG. 21. In this embodiment, a fluidized silicon or other transparent resin is applied in the pin hole 10 in the form of a droplet. The fluidized resin is then solidified in place. Once solidified, the transparent resin may serve as a replacement of the high refraction member 8. As an alternative, as shown in FIG. 23, it is possible to provide a transparent coating layer 8a over the overall surface of the light insulation member 9 formed by deposition of the thin metal film. In such a case, the coating layer 8a may serve as a replacement of the high refraction member 8.

Figure 24:
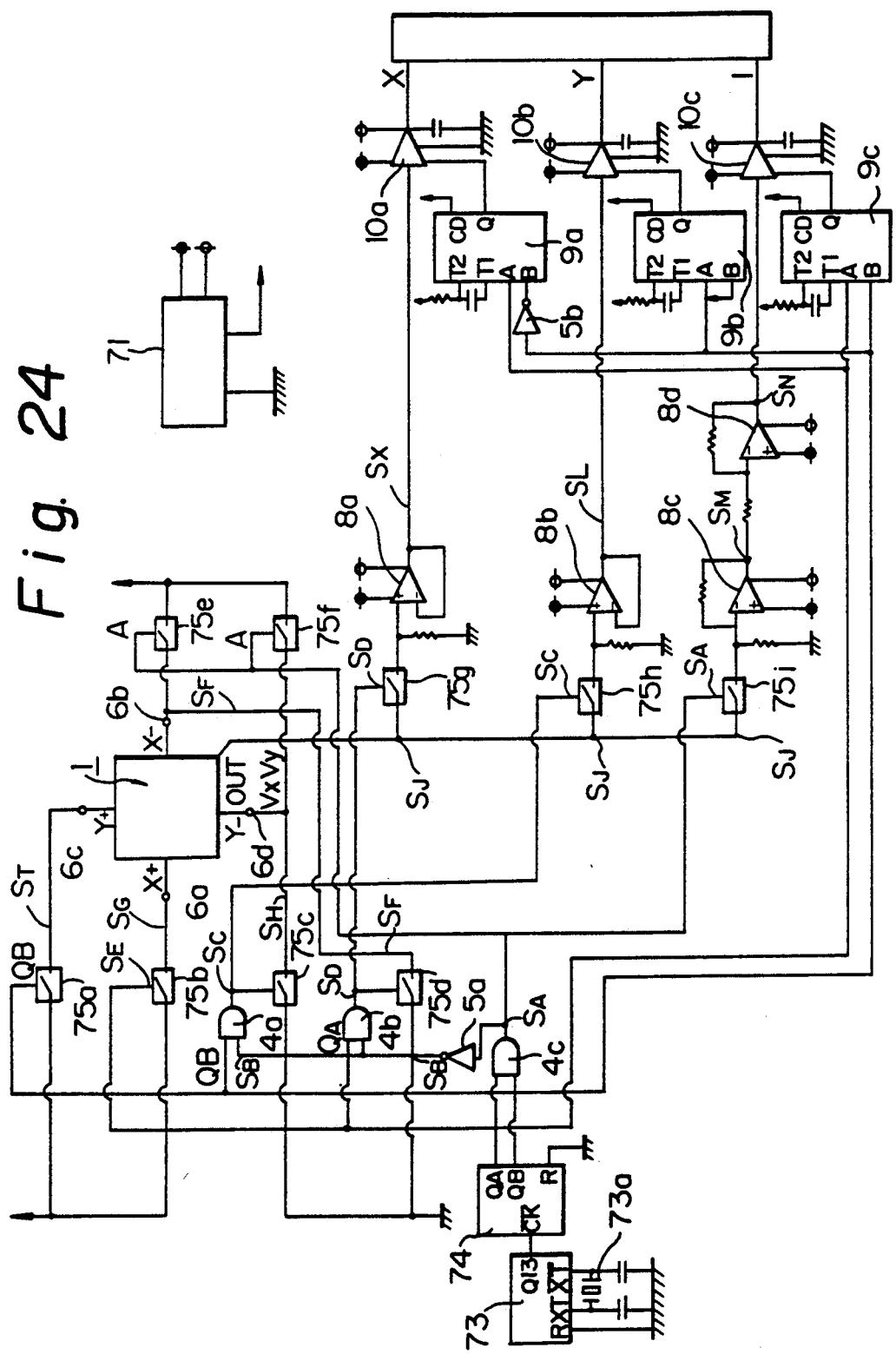
FIG. 24 is a circuit diagram showing detailed circuit construction of a detecting circuit of FIG. 11.

FIG. 24 shows overall circuit construction of the detection circuit 7 to obtain the output of the position detecting element 1 of FIG. 12.

For the input electrodes 6a (X+) and 6b (X−) 5V and 0V are applied respectively, then a voltage Vx as the output (OUT) corresponding to the X coordinate position of the irradiating point P(x, y) is obtained. For the input electrodes 6c (Y+) and 6b (Y−) 5V and 0V are applied respectively, then a voltage Vy as the output (OUT) corresponding to the Y coordinate position of the irradiating point P(x, y) is obtained. Then, by applying 5V for all of the input electrodes 6a (X+), 6b (X−), 6c (Y+) and 6d (Y−), the current at the output (OUT) that corresponds to the intensity of sun beam, i.e. insolation magnitude, is obtained.

The foregoing three actions are repeated with synchronization by clock. The above-mentioned output (OUT) is provided at X, Y and I on the OUTPUT terminal.

Practical operation will be discussed herebelow.

Figure 25:
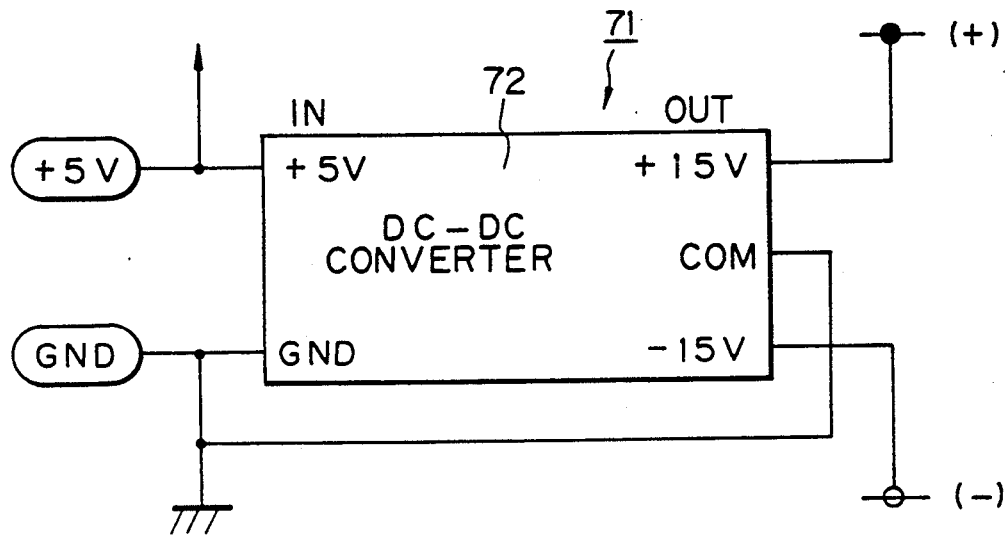
FIG. 25 is a circuit diagram showing a power source construction of the detecting circuit of FIG. 23.

In order to implement the shown embodiment, +5V, 0V (GND) and ±15V are necessary as the power source 71, as shown in FIG. 25. ±15V is generated by means of a DC—DC converter 72 from the supplied +5V. It should be noted that +5V is supplied through the portions indicated by an arrow, +15V is supplied through the portions of solid circles and −15V is supplied through the portions of hollow circles. ±15V is required, because of the employment of a ±15V operational amplifier of, which will be discussed later.

A crystal oscillator 73a is provided for generating the oscillation of a constant frequency. The oscillation of the crystal oscillator 73a is subject to frequency division by a counter 73 to provide a reference clock, which is illustrated as CK in FIG. 26. The reference clock is further divided into ½ and ¼ by a counter 74 to generate QA and QB.

Figure 26:
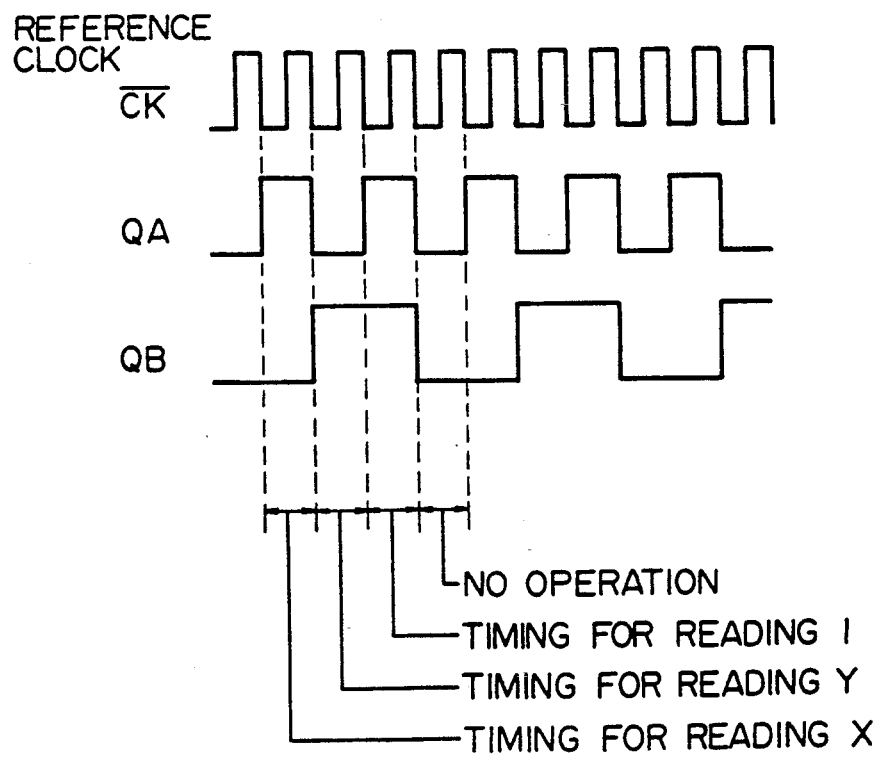
FIG. 26 is an explanatory illustration showing read out timing in the detecting circuit of FIG. 23.

Here, four read out timings can be obtained from a combination of QA and QB respectively at H(=+5V) and L(=0V), as shown in FIG. 26. Among the four timings, the shown embodiment uses three timings.

Next, a discussion will be given for the reading timing of X coordinate position. With the reading timing for X in FIG. 26, i.e. QA=H and QB=L, the states of analog switches 75a, 75b, 75c and 75d are considered. The analog switch 75a is OFF since QB=L. Then, the signal S1 is held L. Therefore, the input electrode 6c of the position detecting element 1 is held open. The analog switch 75b is ON because the QA=H and thus SE is H/ Therefore, a signal SG is H to apply +5V for the input electrode 6a of the position detecting element 1. The analog switch 75b is controlled by the states of the QB and a signal SB by an AND(logical operator) 4a. The signal SB is determined by an AND (logical operator) 4c and a NOT (logical operator) 5a. Now, since QA=H and QB=L, a signal SA and by NOT 5a, the signal SB is H to input H and L for AND 4a. Therefore, a signal SC becomes L. Accordingly, the analog switch 75c is OFF. At this time, a signal SH is L to open the input electrode 6d of the position detecting element 1. The analog switch 75d is controlled by the AND 4b based on the states of QA and the signal SB. Now, QA=H and signal SB is H, then a signal SD becomes H. Accordingly, the analog switch 75d is ON to make a signal SF 0V (GND). Therefore, 0V (GND) is applied to the input electrode 6b of the position detecting element 1.

As set forth above, in this condition, the input electrode 6a (X+) is applied +5V, the input electrode 6b (X−) is applied 0V, and the input electrodes 6c (Y+) and 6d (Y−) are held open. Therefore, at this condition, the X coordinate position can be detected. At this time, if a sun beam is irradiated on the position detecting element 1 and the light spot H reaches the detecting surface 1a of the position detecting element 1, a signal SJ indicative of the potential at the X coordinate position is provided as the output (OUT) through the common output electrode 5 of the position detecting element 1.

As set forth, the signal SJ indicative of the potential of the X coordinate position is in a state applied to the left side of the analog switches 75g, 75h and 75i. Here, the state of the analog switches 75g, 75h and 75i will be considered.

The analog switch 75g is ON due to H of the signal SD. The analog switch 75h is OFF due to L of a signal SC. The analog switch 75i is OFF due to L of the signal SA. Then, a signal SK becomes equal to SJ (potential of the X coordinate position). It should be noted that an operational amplifier 8a is an impedance conversion type voltage follower. The operational amplifier 8a is not always necessary and thus can be neglected in some cases.

Similarly, the potential indicative of the Y coordinate position is output at Y reading out timing and illustrated in FIG. 26.

At the timing illustrated in FIG. 26, the current I flowing through the common output electrode 5 of the position detecting element 1 can be established as follows. Since QA=H and QB=H, +5V is applied for all of the input electrodes 6a (X+), 6b (X−), 6c (Y+) and 6d (Y−). At this time, the analog switches 75g and 75h are OFF. Therefore, the signal SJ passes the analog switch 75i. In response to this, an operational amplifier 8c feeds a signal SM, from which a signal SN is produced by an operational amplifier 8d. It should be noted that the operational amplifiers 8c and 8d serve to convert the current into voltage.

The reference numerals 9a, 9b, 9c denote monostable multi-vibrators, 10a, 10b and 10c denote operational amplifiers.

While a signal SK as the potential indicative of the X coordinate position, the A and B of the monostable multi-vibrator 9a are maintained A=H and B=H. Therefore, Q is held H. At this condition, the data is updated and thereafter, the X as the potential indicative of the X coordinate position is held. During this period, Q's of the monostable multi-vibrators 9b and 9c are maintained L.

It should be noted that the Y as the potential indicative of the Y coordinate position and corresponding to the signal SL, and the I as the potential indicative of the magnitude of insolation and corresponding to the signal SN are derived through a similar process as set forth above. Therefore, the detailed discussion of the said process is omitted.

Figure 27:
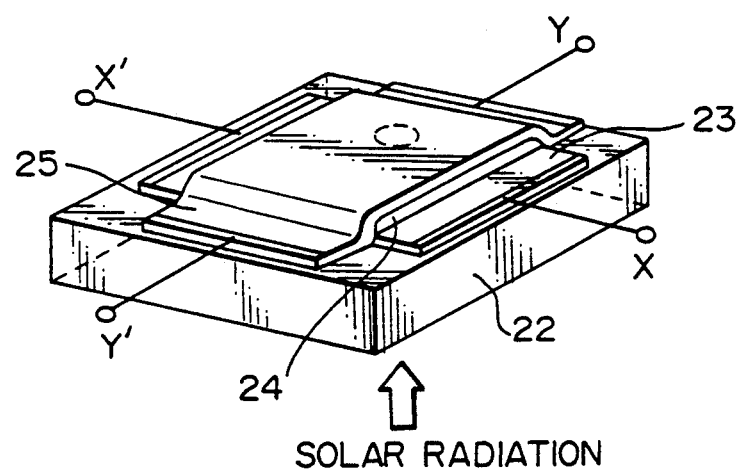
FIG. 27 is a perspective view briefly showing another construction of the position detecting device according to the invention.
Figure 28:
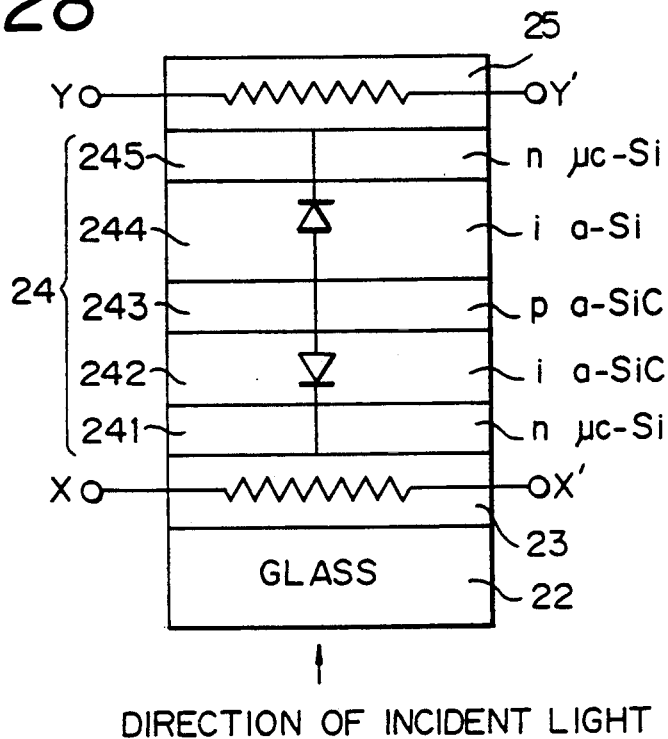
FIG. 28 is a diagrammatic illustration showing the layer structure of FIG. 26.

FIG. 27 is a schematic perspective view of another construction of the position detecting element to form the position detecting device according to the present invention. FIG. 28 is a diagrammatic illustration showing layer structure of the position detecting element of FIG. 27. It should be noted that FIGS. 27 and 28 are illustrated in a position where the light is irradiated from the lower side.

The position detecting element includes a glass substrate 22. A resistant film layer 23 for detecting the X coordinate position of the irradiating point of the light spot, which is formed of a transparent resistantive material, a photoconductive film layer 24 utilizing photoconducting effect of the photoelectric concerting layer, a resistant film layer 25 for detecting the Y coordinate position of the irradiating point of the light spot, which is made of a transparent resistant material, are laminated on the glass substrate 22 in order. From each of the resistant film layers 23 and 25 for X and Y coordinate position detection, the respective two lead electrodes X, X', Y and Y' are extended.

At the connecting portions of respective lead electrodes X, X', Y and Y', strip electrodes having a lower resistance than those of the resistant film layers 23 and 25 for X and Y coordinate position detection.

In the shown construction, the photoconductive film layer 24 is disposed between the resistant film layers 23 and 25 to avoid direct contact therebetween. The resistant film layers 23 and 25 for X and Y coordinate position detection are arranged perpendicular to each other. In absence of the light spot, the resistant film layers 23 and 25 are maintained in a substantially isolated position from each other.

The following are discussions for the composition of respective layers of the position detecting element.

The glass substrate 22 is made from soda glass 1.1 mm thick. $SiO_2$ coating is provided on the surface of the soda glass. It should be noted that the thickness of the glass substrate 22 will not affect for the characteristics of the position detecting device, which detects the light irradiating position and light intensity.

The resistant film layer 23 for detecting the X coordinate position of the irradiating point of the light spot is formed of $SnO_2$ having a thickness of 600 Å. The resistant film layer 23 is provided a sheet resistance value of 200 $\Omega/cm^2$. For the resistant film layer 23, the required function is to permit the light to pass and have an appropriate sheet resistance. Accordingly, as a material for forming the resistant film layer 23, ZnO, ITO and other thin metal films can be used in addition to $SnO_2$.

The photoconductive film layer 24 has a five layer construction including a n-type semiconductor 241 of fine crystalline Si ($\mu$c-Si), an i-type semiconductor 242 of pure a-SiC ($i_1$-SiC), a p-type semiconductor 243 of a-SiC, an i-type semiconductor 244 of pure a-SiC ($i_2$-SiC) and a n-type semiconductor 245 of fine crystalline Si ($\mu$c-Si), as shown in FIG. 28. Such construction is equivalent to an opposite connection of a pair of diodes.

For the photoconductive film layer 24, conversion to low resistance is only required at the portion where the light spot is irradiated. In addition, it is important for the photoconductive film layer 24 to have appropriate thickness of the i-type semiconductor (hereafter referred to as $i_1$ layer) 242 and the i-type semiconductor (hereafter referred to as $i_2$ layer) 244. Namely, the thicknesses of the $i_1$ and $i_2$ layers are determined so that the light current to be generated by irradiation of the light spot may establish good balance. Furthermore, the conductivity of the photoconductive film layer 24 upon irradiation of the light is set to be greater than or equal to $10^{-6}$ ($\Omega/cm$).

Figures 32, 33:
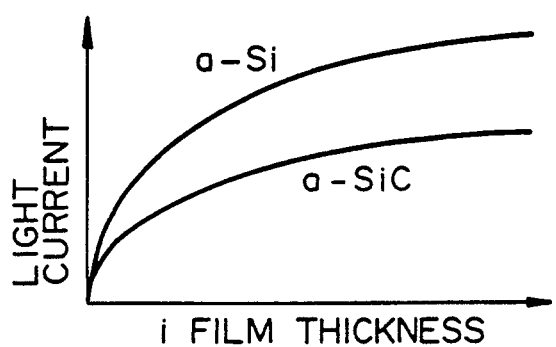
FIG. 32 is a characteristic chart showing a light current relative to the thickness of i film when i film in the showing embodiment of the position detecting element is a-SiC and a-Si.
FIG. 33 is a table showing optima values of film thickness of i1 film and i2 film and light current in the shown embodiment.

Optimal values of the $i_1$ and $i_2$ layers are shown in FIG. 33.

In this case, in order to establish a balance of the light currents in the layer construction of the photoconductive film layer 24 of FIG. 28, the $i_2$ layer 244 positioned far from the light is thicker than that of the $i_1$ layer 242. The preferred range of the thickness ratio between the $i_1$ layer 242 and the $i_2$ layer 244 is 1 : 2 to 1: 10.

The resistant film layer 25 for detecting Y coordinate position of the irradiating point is formed of Ti with a thickness of 400Å. Basically, the resistant film layer 25 for Y coordinate position detection can be the same as the resistant film layer 23 for X coordinate position detection. However, as can be appreciated from FIG. 27, passing of the light is not required. Therefore, as far as the resistance value can be maintained to be greater than or equal to 10 $\Omega/cm^2$ and less than or equal to 1 $M\Omega/cm^2$, various materials, such as metals including Ti, Cr, Ni and so forth, TiN, Ag paste, Ni paste, Cu paste and so forth, in addition to the material of the resistant film layer 23 for X coordinate position detection, can be used for forming the resistant film layer 25 for Y coordinate position detection.

Figure 29:
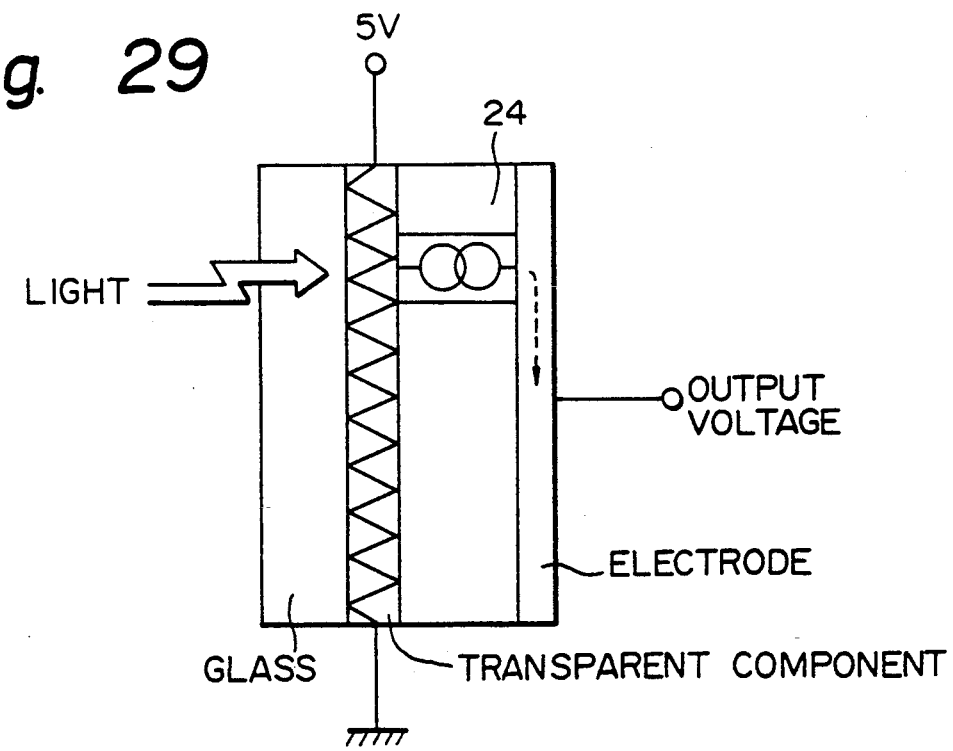
FIG. 29 is a schematic diagram showing the principle of operation of the position detecting element according to the invention.
Figure 31:
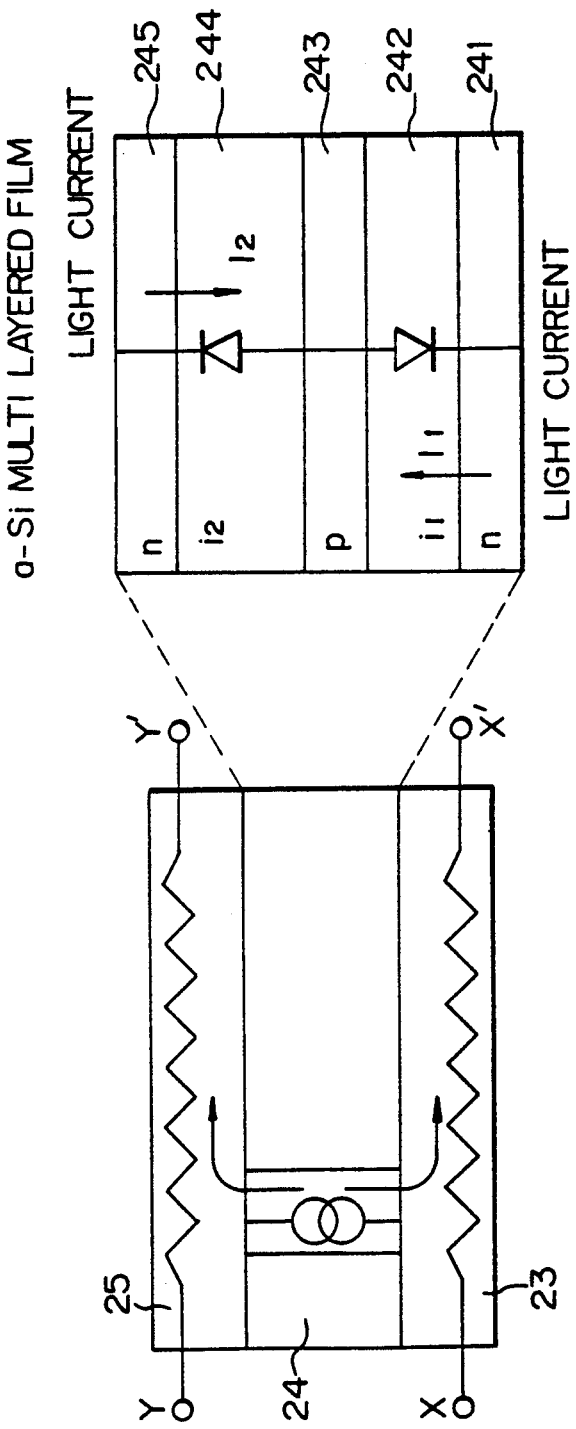
FIG. 31 is a schematic illustration of circuit construction of the shown embodiment of the position detecting element.

FIG. 29 is a diagrammatic illustration showing the principle of operation of the position detecting element set forth above.

On both ends of the transparent resistant film layers, 0V and 5V (the values of which are not necessarily specified to be 5V and thus should be appreciated as an example) are applied. Then, a voltage gradient between 0V to 5V is induced in the transparent resistant film layer. When the light is irradiated on the photoconductive film layer 24 at this condition, the part of diodes at the corresponding position becomes conductive.

Then, the specific potential of the corresponding position of the transparent resistant film layer irradiated by the light is drawn to the electrode. By this, the potential corresponding to the position irradiated by the light can be obtained. This is substantially equivalent to putting a tester probe on the transparent resistant film layer having a voltage gradient to read the potential at the corresponding position. Instead of putting the tester probe, the light is irradiated to make the corresponding portion conductive to extract the potential thereat.

In the position detecting element according to the shown embodiment, the resistant film layers 23 and 25 for X and Y coordinate position detection are provided sheet resistance values within a range of greater than or equal to 10 $\Omega/cm^2$ and less than or equal to 1 $M\Omega/cm^2$ to form the layer structure as illustrated in FIG. 27. With the shown construction, three functions to detect the X coordinate position, Y coordinate position and the current can be performed.

Figure 30:
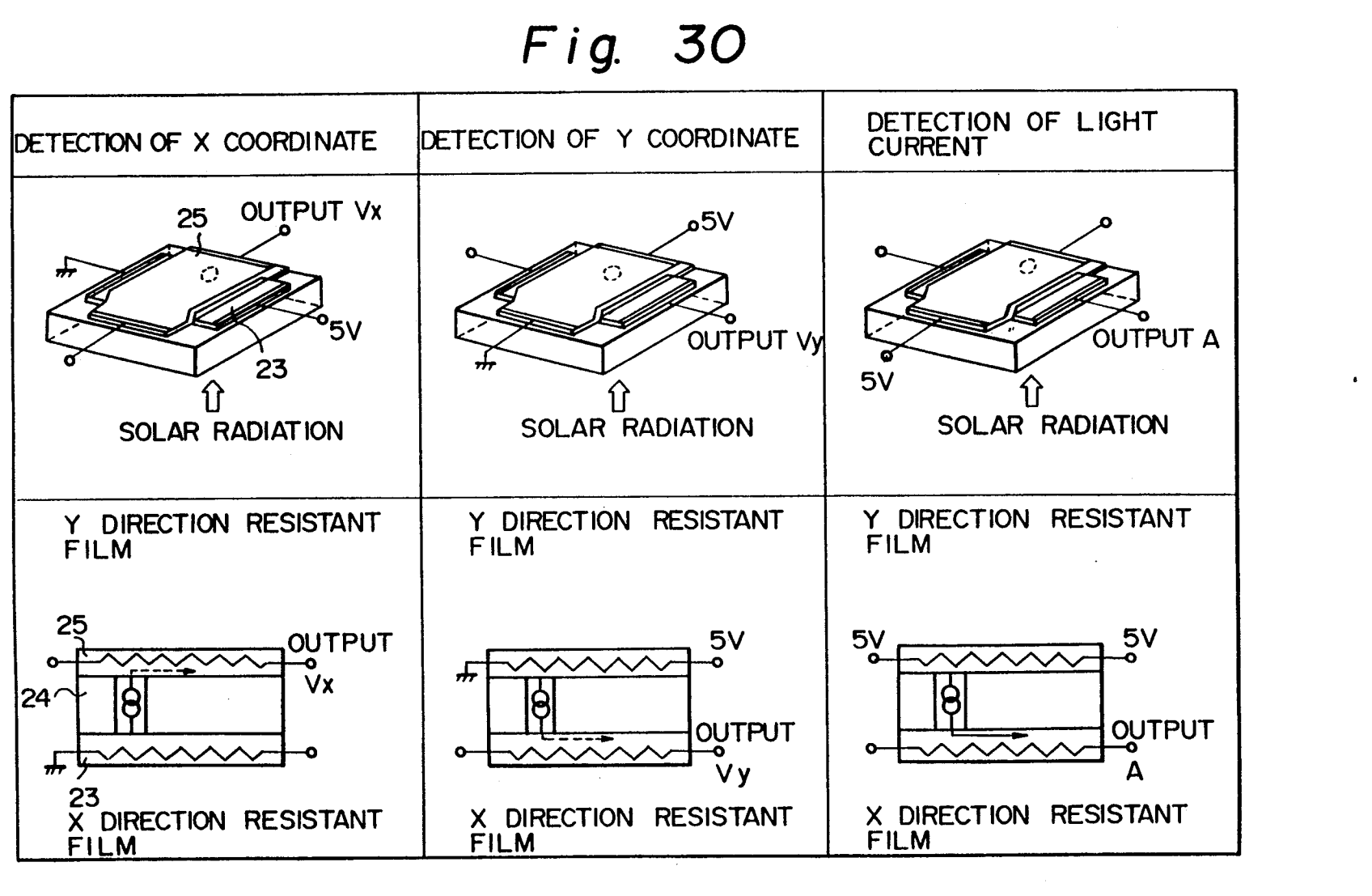

FIG. 30 is an explanatory illustration showing the principle in the detection of a X coordinate position, a Y coordinate position and the current.

X Coordinate Position Detection

For both end electrodes (lead electrodes X, X') of the resistant film layer 23 for X coordinate position detection, 5V and 0V are applied to obtain the potential corresponding to the positions on one of or both of the end electrodes of the resistant film layer 25 for Y coordinate position detection. At this time, the current flows from the resistant film layer 23 for X coordinate position detection to the resistant film layer for Y coordinate position detection through a position where the light is irradiated on the photoconductive film layer 24. Here, it is necessary that the influence of the residual resistance of the resistant film layer 25 for Y coordinate position detection for the output can be ignored. Namely, in the case of a digital multi-meter, an input impedance greater than or equal to 1 $M\Omega$ is desirable. When the input impedance is small and the resistance value of the resistant film layer 25 for Y coordinate position detection is 1 $M\Omega/cm^2$, the output voltage can be attenuated.

Y Coordinate Position Detection

Since the manner of detection is substantially the same as those for detecting the X coordinate position, detailed discussion is omitted. (It should be noted that, in this case, the voltages are applied for both end electrodes of the resistant film body 25 for Y coordinate position detection, and current flows from the resistant film layer 25 for Y coordinate position detection to the resistant film layer 23 for X coordinate position detection. Similar to the above, the current may flow through photoconductive film layer 24 at a position where the light is irradiated.)

Current (Light Intensity) Detection

For this, 5V is applied for both end electrodes of the resistant film layer 25 for Y coordinate position detection. By this, the potential distribution of the resistant film layer 25 becomes uniform. At this condition, the light spot is irradiated on the photoconductive film layer 24 to make the corresponding position conductive to permit the flow of the current from the resistant film layer 25 to the resistant film layer 23 for X coordinate position detection. Thus, the output current can be detected through the resistant film layer 23. The magnitude of the output current does not change depending upon the irradiating position of the light spot on the photoconductive film layer 24 (since potential is uniform at all positions on the resistant film layer 25). Therefore, the magnitude of the output current may be solely dependent on the intensity of the irradiated light (magnitude of insolation). Since the photoconductive film layer 24 is constructed to have a pair of diodes of opposite polarities that have equal electric characteristics, light intensity can be sensed utilizing either the resistant film layer 23 for X coordinate detection or the resistant film layer for Y coordinate position detection. Therefore, equivalent detection of light intensity can be performed by applying 5V for both end electrodes of the resistantive film layer 23.

In the construction set forth above, it is essential to arrange the diodes to have opposite polarities so that the light current generated by irradiation of the light on the photoconductive film layer 24 can cancel each other. For this, it is important to optimally determine the layer thickness. Namely, if the light current to be generated in each of the diodes in the photoconductive film layer 24 are not equal to each other, an imbalance component of the current may affect the output current to create a difference in the detection of light intensity utilizing the resistant film layer 23 for X coordinate position detection and utilizing the resistant film layer 25 for Y coordinate position detection. Namely, an imbalance of the output current reflects an imbalance of the internal resistance in the layers to affect the accuracy of detection.

Therefore, the inventors have attempted to optimize the layer thickness for $i_1$ layer 242 and $i_2$ layer 244 to establish a balance of light currents $I_1$ and $I_2$ in the diodes of the photoconductive film layer 24. It should be noted that, in view of the required accuracy of detection for the position detecting device, the light current $I_1$ and $I_2$ are to be matched to each other within a range of ±30%. If the light currents $I_1$ and $I_2$ are equal to each other, no light current may logically flow. However, light current $I_1$ and $I_2$ of equal but opposite direction are considered to flow.

Assuming the materials of $i_1$ layer 242 and $i_2$ layer 244 are respectively a-SiC and a-Si, the relationship between the light current ($\mu A$) and the layer thickness (mm) of the i-type semiconductors is observed as illustrated in FIG. 32. By solving the equation of absorption coefficients and the continuity of these materials, the layer thicknesses as shown in FIG. 3 are determined.

At the determined layer thicknesses, in the composition of the layers in FIG. 28, i.e. the $i_1$ layer 242 is formed of a-SiC and $i_2$ layer is formed of a-Si, the light currents become equal to each other. On the other hand, when both the $i_1$ and $i_2$ layers 242 and 244 are formed of a-Si, the layer thicknesses are different from those shown in FIG. 33.

As can be appreciated herefrom, it is necessary to make the light currents consistent with each other in the detection of the X coordinate position and the Y coordinate position in the position detecting element.

Figure 34:
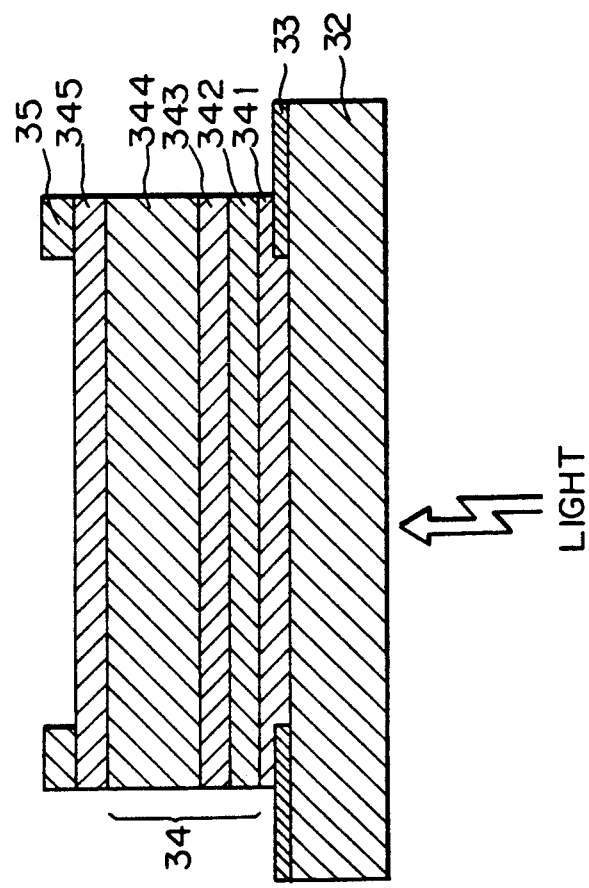
FIG. 34 is a longitudinal section of another layer construction in a position detecting element in the position detecting device according to the invention.
Figure 35:
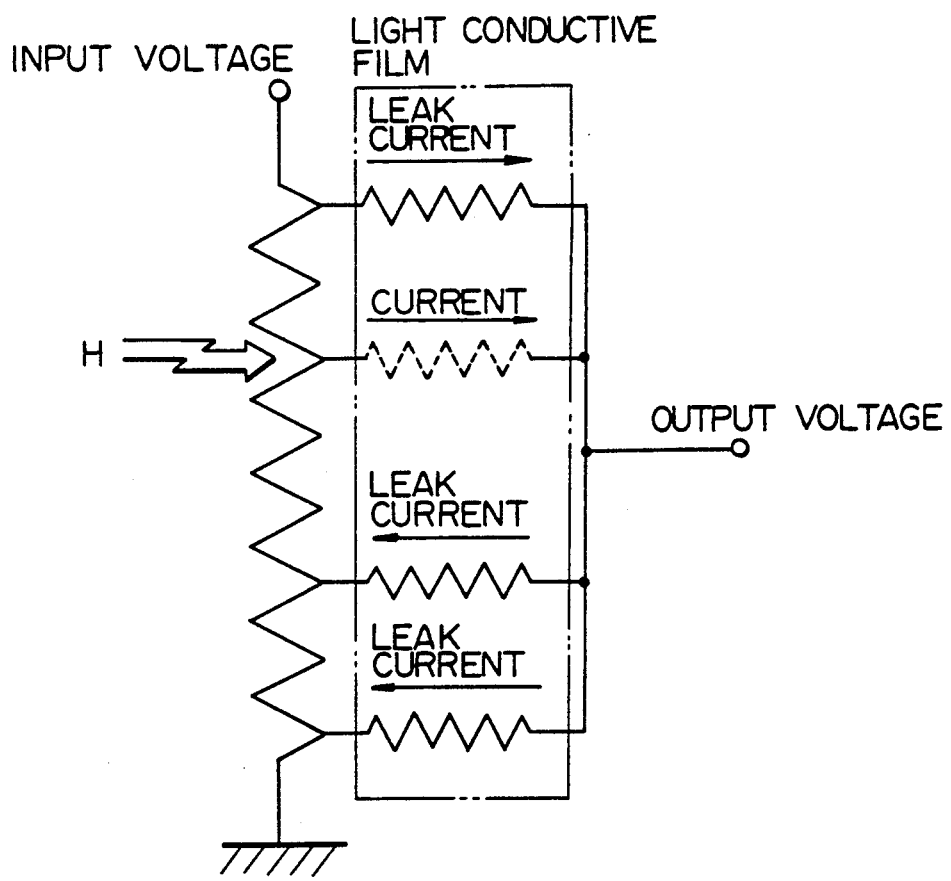
FIG. 35 is a diagrammatic illustration of the photoconductive film forming the conventional position detecting element.

FIG. 34 is a longitudinal section showing a layer structure in another embodiment of the position detecting device according to the present invention.

In this embodiment, the position detecting element is fabricated by directly forming the photoconductive film layer 34 on the glass substrate 32 instead of interpositioning the resistant film layer therebetween. In the shown embodiment, the photoconductive film layer 34 is composed of a n-type semiconductor 341 of fine crystalline Si ($\mu$c-Si), an i-type semiconductor 342 of pure a-Si, a p-type semiconductor 343 of a-SiC, an i-type semiconductor 344 of pure a-Si and a n-type semiconductor 345 of fine crystalline Si ($\mu$c-Si). In this case, it becomes necessary to preliminarily form the input (output) electrodes 33) with metal or metal paste by deposition or spattering on the glass substrate 32.

The feature of the layer structure of the shown embodiment of the position detecting element is that one or both of the n-type semiconductors 341 and 345 of fine crystalline Si serve as one of or both of resistant film layers 23 and 25 for X coordinate position detection and for Y coordinate position detection. In this case, the fine crystalline Si does not vary in resistance value even when the light is irradiated and thus can serve as a reference resistance.

In the embodiment of FIG. 34, in the place of the resistant film layers 23 and 25 for X coordinate position and Y coordinate position in the former embodiment of FIG. 28, the input (output) electrodes 33 and the output (input) electrodes 35 are formed directly on the n-type semiconductors.

Although such layer construction may cause slight degradation of temperature characteristics of the position detecting device, the device may operate up to 100° C. without causing any substantial problem. It should be noted that when the n-type semiconductors are not used as the resistant film layer, the photoconductive film layer with the n-i-p-i-n layer structure may operate up to 140° C. without causing any problems.

With the constructions set forth above, the present invention can realize various advantages and effects. The effect and advantages in the first aspect of the present invention is as follows. The photoconductive layer is laminated on the resistant layer and has diode components of opposite polarities laminated in series to each other, and the portion where the light passes becomes conductive to permit the light current to flow owing to the light induced power in the respective diode components. On the other hand, by applying different voltages at both ends of the resistant film layer, potential distribution occurs in the resistant film layer. Through the output electrode, the given potential corresponding to the position where the light passes is extracted from the resistant film layer. The current flowing from the resistant film layer to the output electrode is called the output current, which is distinguished from the light current induced by photoelectric conversion in the diode components. With the means for irradiating a spot form of light, the irradiating position of the spot form light and intensity thereof can be detected to output the signal indicative thereof through the output electrode. On the other hand, the output current is substantially proportional to the intensity of the light.

The photoconductive layer in the position detecting device according to the invention will not cause a leak in current flowing from the resistant layer to the output electrode even at an elevated temperature caused by the effect of layer construction, in which the diodes components are arranged to have opposite polarities.

Accordingly, based on the output from the output electrode through the photoelectric converting layer, the position and intensity of the light can be accurately detected. On the other hand, even when the relatively large potential gradient occurs on the surface of the resistant film layer to increase the output current, a small leak in current would not occur. Therefore, a sufficiently large output corresponding to the light irradiating position can be obtained.

According to the second aspect of the invention, the following effects and advantages can be obtained.

The device according to the first aspect of the invention is applied to an automotive vehicle. Then, the means for irradiating the spot form light comprises a means for irradiating a spot form sun beam irradiated on the automotive vehicle, By this, through the output electrode, signals representative of the direction, height and intensity of the sun beam can be output through the output electrode.

According to the third aspect of the invention, the following effects and advantages can be achieved. In the first aspect of the invention, the four input electrodes are provided at four corners of the resistant film layer. Utilizing two of these four electrodes, potential distribution in the lateral direction of the resistant film layer can be detected. Also, utilizing another two of these four electrodes, potential distribution in the longitudinal direction of the resistant film layer can be detected.

In addition, when predetermined voltages are applied to the input electrodes, the signals representative of the light position and light intensity can be obtained at different timing on a time division basis.

On the other hand, according to the fourth aspect of the invention, the following effects and advantages can be obtained. The diode components in the photoelectric converting layer in the first aspect forms mutually opposite polarities of diode components. In view of the output current to be induced by irradiation of the light, a greater magnitude of light current than the light current generated in the diode component having a forward bias is generated in the diode component having a reverse bias, for example. By such arrangement, the light current generated in the diode component with the reverse bias flows in a forward bias directed and added to the output current.

With such arrangement, to make the magnitude of the light currents in the diode components of the photoelectric converting layer unbalanced and in opposite direction, the unbalanced light current can be obtained through the output electrode in addition to the specific potential on the resistant film layer representative of the specific position thereof. Therefore, the signal representative of the light intensity can be obtained at a relatively large magnitude to provide high sensitivity.

According to the fifth aspect of the invention, the following effects and advantages can be obtained. The resistant film layers in the first aspect of the invention comprise a first transparent resistant layer at the side close to the light and a second transparent resistant layer at the side far from the light. These first and second resistant layers are respectively provided with input electrodes and potential distribution is provided periodically by periodically applying predetermined voltages through the input electrodes on a time division basis. The potential distribution on the first resistant layer is differentiated from that in the second resistant layer by direction. On the other hand, the output electrode is provided on the second resistant layer to output the specific potential at the specific position of the first resistant layer through the photoelectric converting layer. Therefore, this serves as the first output electrode, which commonly acts as the input electrodes for the second resistant layer on a time division basis. Also, on the first resistant layer, the second output electrodes for outputting the specific potential at the specific position of the second resistant layer are presented. The second output electrodes also serve as the input electrodes for the first resistant layer on a time division basis.

It should be noted that in the construction providing the input electrodes at four corners with a single resistantive layer, the input electrodes positioned on the sole layer of resistant layer, and not active for establishing the potential gradient, may affect the potential distribution established by other input electrodes on the same resistant layer. According to the shown device, since the input electrodes are separated for the first resistant layer and for the second resistant layer to avoid distortion of the potential distribution. The signals representative of the position where the spot form light is irradiated is extracted through the first output electrodes and the second output electrodes on a time division basis.

Furthermore, according to the sixth aspect of the invention, the following effects and advantages can be obtained. The diode components in the photoelectric converting layer in the fifth aspect comprise diode components having mutually opposite bias directions. In view of the output current, the diode components in the forward bias side and the reverse bias sides are adapted to generate an equal magnitude of light current for substantially establishing balance.

With this construction, the output current can be obtained as a composite current of the output currents obtained through the first and second output electrodes as signals representative of the position of the light on a time division basis. At this time, since the diode components are adapted to establish a balance of the light current to be generated, the light currents cancel with each other so as not to flow out. Therefore, the output current solely depending upon the specific potential at the specific position corresponding to the light irradiating position can be obtained at the output electrode. Namely, at the output electrode, accurate potential corresponding to the light irradiating position can be obtained.

According to the seventh aspect of the invention, the following effects and advantages can be obtained.

The device according to the fifth aspect of the invention is applied to an automotive vehicle. Then, the means for irradiating the spot form light comprises a means for irradiating a spot form sun beam irradiating on the automotive vehicle.

By this, the signals indicative of the direction, height and intensity of sun beam irradiating on the automotive vehicle can be obtained.

We claim:

1. A device for detecting a position and an intensity of a light, comprising:
   at least one resistant layer having a sheet resistance;
   a photoelectric converting layer laminated on and overlapping said resistant layer and forming a first diode and a second diode arranged in series having opposite polarities; said first diode and said second diode having properties to become conductive when said light passes through a portion of said photoelectric converting layer and causing a photoelectromotive force therein;
   input electrode for establishing a predetermined potential distribution on said resistant layer;
   a first output electrode for extracting said predetermined potential on said resistant layer through said portion where said light passes;
   means for irradiating said light in a spot form on said photoelectric converting layer and through said resistant layer, said photoelectric converting layer producing a signal representing a height, a direction and said intensity of said light.

2. The device of claim 1, wherein said device is provided on an automotive vehicle, and wherein said means for irradiating said light comprises means for irradiating sunlight impinging on said automotive vehicle into a spot form, said signal representing said height, said direction and said intensity is output on said first output electrode.

3. The device of claim 1, wherein said resistant layer includes four corners, each corner having an input electrode attached.

4. The device of claim 1, further comprising means for extracting a first signal indicative of said height and said direction of said light and a second signal indicative of said intensity of said light; said extracting means extracting said first signal and said second signal through said first output electrode alternately in a time division manner.

5. The device of claim 4, wherein said first diode and said second diode each provide different magnitudes of photoelectromotive force when irradiated by said light so that an ability to generate a current in said resistant layer is increased and said first signal and said second signal are affected by a difference component of said different magnitudes of photoelectromotive force provided by said first diode and said second diode.

6. The device of claim 4, wherein said first diode and said second diode provide substantially identical magnitudes of photoelectromotive force, said identical magnitudes having opposite polarities when irradiated by said light.

7. The device of claim 1, wherein said at least one resistant layer comprises a first resistant layer and a second resistant layer; said first resistant layer positioned closer to said light than said second resistant layer with respect to a traveling direction of said light; said first resistant layer and said second resistant layer each having input electrodes for alternately establishing potential distributions in mutually intersecting directions on a time division basis, said first output electrode provided on said second resistant layer and being common with said input electrodes on said first resistant layer; said device further comprising a second output electrode provided on said first resistant layer and being in common with said input electrode on said second resistant layer, said photoelectric converting layer being between said first resistant layer and said second resistant layer.

8. The device of claim 7, wherein said device is provided on an automotive vehicle, and wherein said means for irradiating said light comprises means for irradiating sunlight impinging on said automotive vehicle into a spot form, said signal representing said height, said direction and said intensity is output on said first output electrode and said second output electrode.

9. A light position detecting element comprising:
   a substrate;
   a resistant layer formed on said substrate;
   a first pair of electrodes;
   a second pair of electrodes, said first pair of electrodes and said second pair of electrodes arranged on peripheral edges of said resistant layer for applying voltages in a mutually perpendicular direction;

a photoelectric converting layer formed on said resistant layer having a first photo-diode and a second photo-diode arranged in series and having opposite polarities; and an output electrode layer formed on said photoelectric converting layer on a side opposite to said resistant layer.

10. A light position detecting element comprising:
a substrate;
a first resistant layer formed on said substrate and having a first set of opposing edges;
a photoelectric converting layer formed on said first resistant layer having a first photo-diode and second photo-diode arranged in series and having opposite polarities;
a second resistant layer formed on said photoelectric converting layer, opposite to said first resistant layer, having a second set of opposing edges being perpendicular to said first set of opposing edges;
a first pair of electrodes provided along said first set of opposing edges, one electrode to each opposing edge; and
a second pair of electrodes provided along said second set of opposing edges, one electrode provided on each opposing edge.

11. The position detecting element of claim 10, wherein said first pair of electrodes and said second pair of electrodes both comprise input electrodes and output electrodes.

12. The position detecting element of claim 10, wherein said first resistant layer and said second resistant layer each have a sheet of resistance being greater than or equal to 10 $\Omega/cm^2$ and less than or equal to 1 $M\Omega/cm^2$.

13. The position detecting element of claim 10, wherein said photoelectric converting layer is formed of a material selected from the group consisting of amorphous alloy hydrides, amorphous alloy fluorides and composite semiconductor materials formed into at least one of a n-i-p-i-n layer structure, a p-i-n-i-p layer structure, an n-p-n layer structure and a p-n-p layer structure, said layer structure substantially forming said first photo-diode and said second photo-diode.

14. The position detecting element of claim 13, wherein said amorphous alloy hydrides are selected from the group consisting of a-Si:H, a-SiC:H, a-SiGe:H, A-SiN:H and $\mu$c-Si:H.

15. The position detecting element of claim 13, wherein said composite semiconductor material includes a compound selected from the group consisting of CdTe and CdSe, CuInSe$_2$.

16. The position detecting element of claim 10, further comprising:
means for alternately applying voltages having a predetermined voltage difference through said first pair of electrodes and said second pair of electrodes; and
means for detecting a first voltage output through said second pair of electrodes when said predetermined voltage deference is applied to said first pair of electrodes and for detecting a second voltage output through said first pair of electrodes when said predetermined voltage difference is applied to said second pair of electrodes.

17. The position detecting element of claim 10, further comprising:
means for simultaneously applying equal voltages to one of said pair of electrodes and said second pair of electrodes; and
means for detecting a current output from said photoelectric converting layer through one of said first pair of electrodes and said second pair of electrodes, not having said application of said equal voltages, in response to said application of said equal voltages.

18. The position detecting element of claim 13, wherein said photoelectric converting layer further comprises a first i layer and a second i layer each including a different material having a different peak sensitivity to light wavelengths, and said second i layer being thicker than said first i layer.

19. The position detecting device of claim 10, further comprising a light blocking member having a pin hole at the center thereof for blocking all but a spot form of said light irradiating on said photoelectric converting layer.

20. The position detecting device of claim 19, further comprising an optical member having a greater refraction index than air and arranged between said light blocking member and said photoelectric converting layer.

21. The position detecting device of in claim 19, further comprising a transparent resin disposed within said pin hole.

* * * * *